United States Patent
Alvarez, II et al.

(10) Patent No.: US 7,032,158 B2
(45) Date of Patent: Apr. 18, 2006

(54) SYSTEM AND METHOD FOR RECOGNIZING AND CONFIGURING DEVICES EMBEDDED ON MEMORY MODULES

(75) Inventors: Manuel J. Alvarez, II, Austin, TX (US); Thomas A. Dye, Austin, TX (US); Peter Geiger, Austin, TX (US)

(73) Assignee: Quickshift, Inc., Austin, TX (US)

( * ) Notice: Subject to any disclaimer, the term of this patent is extended or adjusted under 35 U.S.C. 154(b) by 506 days.

(21) Appl. No.: 09/840,724

(22) Filed: Apr. 23, 2001

(65) Prior Publication Data

US 2002/0184579 A1 Dec. 5, 2002

(51) Int. Cl.
*G11C 29/00* (2006.01)

(52) U.S. Cl. ........................ 714/763; 714/718
(58) Field of Classification Search ............ 714/718, 714/763, 799, 746, 758, 801, 764; 365/201
See application file for complete search history.

(56) References Cited

U.S. PATENT DOCUMENTS

| | | | | |
|---|---|---|---|---|
| 6,055,653 A | * | 4/2000 | LeBlanc et al. | 714/718 |
| 6,173,381 B1 | | 1/2001 | Dye | 711/170 |
| 6,208,273 B1 | | 3/2001 | Dye | 341/51 |
| 6,523,102 B1 | | 2/2003 | Dye | 711/170 |
| 6,715,116 B1 | * | 3/2004 | Lester et al. | 714/718 |
| 6,822,589 B1 | | 11/2004 | Dye | 341/51 |

OTHER PUBLICATIONS

U.S. Appl. No. 09/239,659, filed Jan. 29, 1999, Dye.

* cited by examiner

*Primary Examiner*—Shelly Chase
(74) *Attorney, Agent, or Firm*—Michael P. Adams; Winstead Sechrest & Minick P.C.

(57) ABSTRACT

A method and system for identifying and configuring device-enhanced memory modules at system startup is described. A driver is described that performs a wakeup procedure at startup to identify installed device-enhanced memory modules, detect memory implementations such as interleaving and striping on memory modules, detect error detection and correction (ECC) implementations, and to configure the identified device-enhanced memory modules to use the detected implementations. The method may include several phases including, but not limited to, a start block phase, an ECC configuration phase, an ECC check phase, an interleave detect and configuration phase, a buffer check phase, and a final configuration phase. One or more of the phases may be performed at system startup and/or during normal system operation. Methods for shutting down and providing a sleep mode for device-enhanced memory modules are also described.

49 Claims, 18 Drawing Sheets

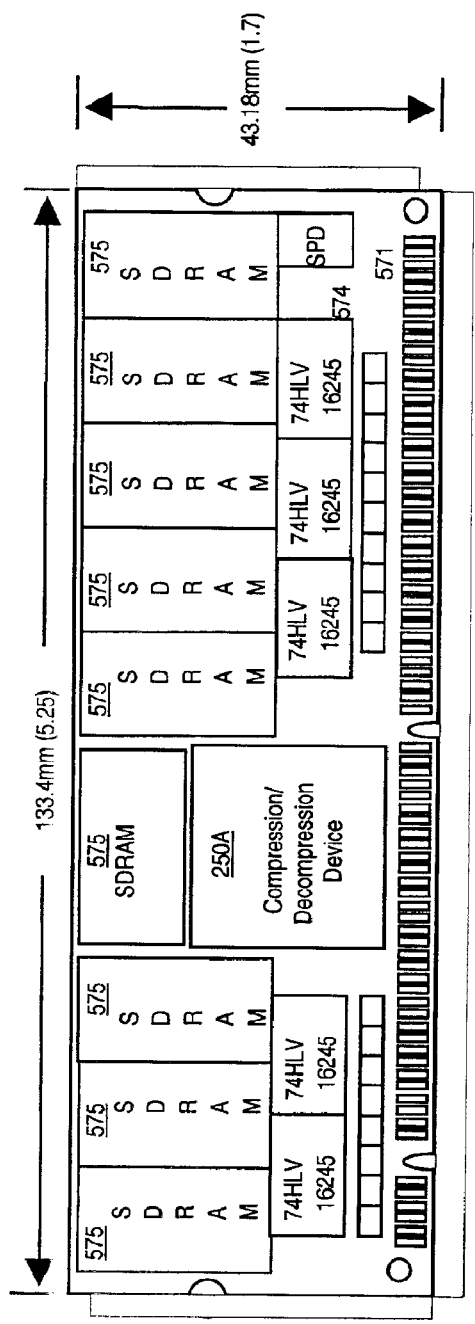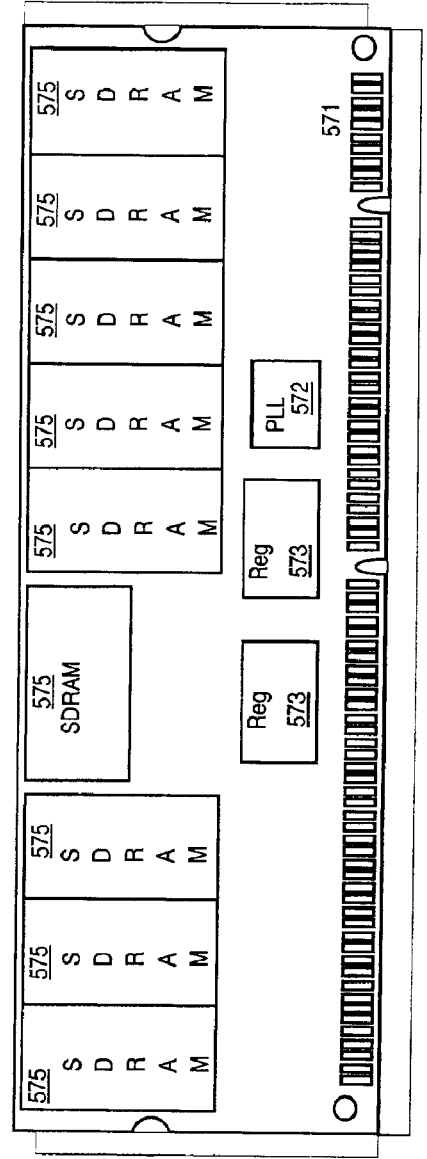
Figure 3a
Figure 3b

DE-MM device logic

ECC Learning Flow

Learning Check Bit Masks

Check Bit Generation

Data Checking and Correction

SYSTEM AND METHOD FOR RECOGNIZING AND CONFIGURING DEVICES EMBEDDED ON MEMORY MODULES

FIELD OF THE INVENTION

The present invention relates to memory systems, and more particularly to recognizing and configuring circuits embedded on industry standard memory modules where such modules operate to improve performance of a computing system by the processing of data in-line with the memory modules independent of the Central Processing Unit.

DESCRIPTION OF THE RELATED ART

System memory modules and architectures have remained relatively unchanged for many years. A system memory generally consists of one or more memory modules under the control of a memory manager implemented in software, hardware or a combination of hardware and software. Functions performed on data being written to or read from system memory generally are performed by software programs executing on the CPU or by hardware such as co-processors or special function chips, generally interfacing with the memory manager through the CPU. Performing compute-intensive operations such as compression and decompression on data tends to be much slower than performing the same operations on hardware. Co-processors or special function chips are generally mounted to the motherboard or installed on a board coupled by bus (such as PCI bus) to the system. Such hardware implementations require tight integration into the system when mounted to the motherboard, or expensive board mounts when installed on a board coupled by bus to the system. In addition, these implementations are not directly "in-line" to memory operations.

An improvement to existing systems is to have one or more memory modules such as DIMMs that can be plugged into any standard memory slot in a PC desktop or Server motherboard that are enhanced with embedded devices to provide one or more functions, for example, data compression and decompression, to the system. Examples of devices that may be embedded on memory modules include, but are not limited to: co-processors, controllers, registers, and engines. Examples of engines that may be embedded on memory modules include, but are not limited to: scalar engines, compression/decompression engines, and encryption/decryption engines. Once installed with the proper drivers, any data in the system may be quickly and efficiently operated on, for example, by being compressed when written to memory by a compression/decompression engine, with little or no perceived delay. The memory module consisting of SDRAM memory and the integrated circuit, or embedded device, may be referred to as a Device Enhanced Memory Module (DE-MM). Interfacing to the DE-MM may be done through a set of APIs, which may allow users to add the functionality provided by the DE-MM to applications. These APIs call drivers that will take care of both the addressing requirements to the memory module and the movement of data to and from the DE-MM for processing.

An important aspect of a DE-MM implementation is recognizing and configuring DE-MMs at system startup (boot time). It is desirable to provide a driver that, at startup, can recognize DE-MMs, distinguish between standard memory modules and DE-MMs, detect memory implementations such as interleaving and striping (sub-cache line memory address space sharing among multiple memory modules), detect Error Detection and Correction (ECC) implementations, and configure the DE-MMs to work in the detected implementations. As memory modules and memory managers generally provide simple, high-speed interfaces without tools for performing the required detections and configurations or other advanced functionality, a novel method of performing these tasks must be provided.

It is desirable to allow the DE-MM to appear as a normal memory module (e.g. DIMM), with all memory available to the user, when the functionality added by the DE-MM is not needed by any application on the system. At boot time, it is desirable for the DE-MM to reset itself in preparation for configuration. It is also desirable for the drivers associated with the DE-MM to recognize and configure DE-MMs when they are installed. In addition, it is desirable for the device embedded on the DE-MM to be deactivated if the configuration indicates that it should, or if configuration is not completed in a timely manner. It is also desirable to provide a wakeup sequence that is unique and improbable under normal operating conditions to prevent the DE-MM from being unintentionally activated. It is also desirable to provide methods for recognizing various aspects of the particular memory implementation of a system, such as error detection and correction (ECC), interleaving, etc., and to configure the DE-MM to operate successfully in the memory implementation.

Prior Art Computer System Architecture

FIG. 1 illustrates a block diagram example of a prior art computer system memory configuration with Host Bus coupled to a Memory Controller. Four standard memory modules are shown installed in the memory slots. In this system, data written to system memory is received from the host bus by the memory controller and written to one or more of the memory modules "as is," with the possible exception of error correction information. The memory controller may include error detection and correction logic (ECC) to detect errors on data read back from memory. This is generally accomplished by appending error detection data to the written data; for example, a 64-bit write to memory may have 8-bit error detection data appended to the 64 bits.

SUMMARY OF THE INVENTION

One embodiment of the present invention discloses a system and process to initialize, operate, and shutdown, through a combination of hardware and software procedures, an integrated circuit or device embedded on industry standard memory modules where such modules operate to enhance the performance of a computing system by performing some function, for example, modifying data written to or read from the system memory. Examples of modifying data written to or read from the system memory include, but are not limited to: compression/decompression and encryption/decryption. Examples of devices that may be embedded on memory modules include, but are not limited to: co-processors, controllers, registers, and engines. Examples of engines that may be embedded on memory modules include, but are not limited to: scalar engines, compression/decompression engines, and encryption/decryption engines.

The preferred embodiment of the present invention relates to computer system architectures, and more particularly to Device Enhanced Memory Modules (DE-MMs), which include an integrated chip or device mounted on Dual In-line Memory Module (DIMM), Small Outline DIMM (SODIMM), Single In-line Memory Module (SIMM), and Rambus® In-line Memory Modules (RIMM) or other types of memory modules. It may include multiple DRAM memory types including SDRAM, DR-RAM, and DDR-DRAM. It may also include memory subsystems that do not use industry standard memory modules, but alternatively couple memory in a plurality of means to other system components.

One embodiment of the present invention comprises an integrated circuit or chip, mounted on an industry-standard memory interface module such as a DIMM, SODIMM, SIMM, or RIMM module, or embedded into the memory subsystem with other discrete components (e.g. the memory controller). The embodiment may also comprise the software methods and procedures required for enabling the operation of the integrated circuit within standard operating system environments. In addition, the embodiment includes the method of transparent memory module operation prior to the activation of the integrated circuit. The integrated circuit may contain technology implementing one or more functions to be performed in-line on data being written to or read from memory. For example, the integrated circuit may implement compression and decompression technology that may provide lossless and/or lossy compression and decompression of data. In alternate embodiments, the integrated circuit may contain other algorithms such as encryption and decryption or other co-processing circuits. The system of the preferred embodiment mounts the integrated circuit onto an industry-standard or de facto standard memory module (for example, DIMM, RIMM, SODIMM, or SIMM). For purpose of this disclosure, the system of the preferred embodiment is referred to as the DE-MM or Device Enhanced Memory Module. By way of example, a compression/decompression circuit may be described, and for the purpose of this disclosure, may be referred to as a C-DIMM or Compression enabled Dual-Inline Memory Module.

In one embodiment, operation may proceed as follows:

First, a series of unique data sequences may be written to memory addresses in memory space to identify one or more DE-MMs among the one or more memory modules installed in the system. These unique data sequences preferably include a series of "illegal" data elements such as illegal computer instructions, operations (op codes), invalid text, etc., that preferably are highly unlikely to be duplicated in normal system reads and writes to memory. This prevents the series of unique data sequences from accidentally occurring during normal operation of the system. The memory space being written to is preferably uncacheable to guarantee the same spots in memory are hit.

When the proper response has been received identifying one or more DE-MMs, the driver may perform Error Detection and Correction (ECC) configuration for the detected DE-MMs. ECC configuration preferably includes a series of writes to the DE-MM. These writes preferably allow the device on the DE-MM to learn the ECC Generation scheme and to configure itself for generating ECC for the data read from the DE-MM, as well as for checking and correcting data written to the device on the DE-MM. At the completion of ECC configuration, the ECC logic of the DE-MM preferably has recognized either an ECC scheme or a valid parity algorithm. The DE-MM preferably automatically configures itself for the appropriate data checking and generation scheme (e.g. ECC or parity). In the case when no valid data checking and generation scheme is recognized, the system may actually be in a non-ECC, non-parity system.

Next, a set of writes of arbitrary data may be performed that will allow an ECC test to occur. The DE-MM preferably checks this data with its newly configured ECC logic to see if the test conditions are satisfied. Preferably, at the completion of the test writes, a read may return an indication of a successful test as well as indicating the final ECC/Parity/No Checking choice. If an ECC Configuration failure occurred, the driver preferably restarts the wakeup sequence to retry the configuration. If continued failures are encountered, then preferably either the system ECC is turned off or alternatively the DE-MM is not activated.

Next, Interleave Initialization may be performed during which interleave settings for the DE-MM may be identified. In Interleave Initialization, the driver preferably allocates a larger area starting with the start block, and then writes a recognizable, but different value in each of the burst lines in that allocated area. Following these writes, multiple reads to the start block will return the data in the order stored by the DE-MM. Each read to the start block may deliver the appropriate bytes and increment the fetch pointer to the next burst line. The driver may then begin reading from the start block. The values returned from these reads to the driver may help the driver determine the interleave characteristics of the system memory implementation. In one embodiment, Interleave Initialization may be restarted from the beginning at any time if desired.

At this point, the start of the DE-MM register memory block is preferably the start block address. The driver now preferably writes to a register on the DE-MM to properly set the Input and Output Buffer offsets. Timers in a DE-MM register may also be set, but are preferably not activated until the wakeup sequence is complete. Next, a Buffer Check may be performed that preferably includes writing a block of bytes into the DE-MM Memory Input buffer, and reading a block of bytes from the DE-MM Memory Output buffer. If the driver has the correct interleave settings and offset settings, the same block of data that is written will be read from the DE-MM at the new location.

Once the ECC is properly configured, the interleave determined, and the buffers tested, final configuration may be performed. During final configuration, the driver preferably reads the Hardware Version Number, Chip Part Number, memory module Serial Number and other information to complete the DE-MM configuration. The driver preferably writes to a register on the DE-MM to properly set the sleep mode timer value, the error timer value, and the restart timer value for the DE-MM. This may be followed by a write to a DE-MM register to make the driver version available to the hardware or other software in the system. The final command is preferably the End Initialization sequence, which preferably resets the compression hardware and arrays, clears all statistics information, and starts the sleep mode and restart timers. The DE-MM 550 is now ready to perform and/or provide access to the functionality of its embedded device(s) in the system. For example, if the DE-MM is a C-DIMM, compression and decompression of data on reads and writes to memory may be provided by an embedded compression/decompression engine on the C-DIMM.

One embodiment of the present invention includes parallel data compression and decompression logic designed for the reduction of data bandwidth and storage requirements and for compressing and decompressing data at a high rate. The compression/decompression logic may be referred to as a "Compactor Chip." The Compactor Chip is preferably included on a memory module such as a DIMM.

In summary, multiple devices of multiple variety and function may be installed for additional performance enhancements or processing of tasks. Thus the device enhanced memory module (DE-MM) and the ability to recognize and configure one or more DE-MMs during the startup process of a system, is a significant advance over the operation of current software based technologies running from a specific CPU application program.

BRIEF DESCRIPTION OF THE DRAWINGS

A better understanding of the present invention can be obtained when the following detailed description of the preferred embodiment is considered in conjunction with the following drawings, in which:

FIG. 3a shows one embodiment of a DE-MM in which an ASIC compression/decompression device is mounted on the front side of an industry standard DIMM to form a C-DIMM;

FIG. 3b shows the layout of the back of the DE-MM of FIG. 3a;

FIG. 4b shows the layout of the back of the DE-MM of FIG. 4a;

DETAILED DESCRIPTION OF SEVERAL EMBODIMENTS

Incorporation by Reference

U.S. patent application Ser. No. 09/239,659 titled "Bandwidth Reducing Memory Controller Including Scalable Embedded Parallel Data Compression and Decompression Engines" whose inventors are Thomas A. Dye, Manuel J. Alvarez II and Peter Geiger and was filed on Jan. 29, 1999, is hereby incorporated by reference in its entirety as though fully and completely set forth herein.

U.S. patent application Ser. No. 09/421,968 now U.S. Pat. No. 6,208,273, titled "System and Method for Performing Scalable Embedded Parallel Data Compression" whose inventors are Thomas A. Dye, Manuel J. Alvarez II and Peter Geiger and was filed on Oct. 20, 1999, is hereby incorporated by reference in its entirety as though fully and completely set forth herein.

U.S. patent application Ser. No. 09/491,343 titled "System and Method for Performing Scalable Embedded Parallel Data Decompression" whose inventors are Thomas A. Dye, Manuel J. Alvarez II and Peter Geiger and was filed on Jan. 26, 2000, is hereby incorporated by reference in its entirety as though fully and completely set forth herein.

U.S. patent application Ser. No. 08/916,464 now U.S. Pat. No. 6,173,381, titled "Memory Controller Including Embedded Data Compression and Decompression Engines" whose inventor is Thomas A. Dye and which was filed Aug. 8, 1997, is hereby incorporated by reference in its entirety as though fully and completely set forth herein.

U.S. patent application Ser. No. 09/550,380 now U.S. Pat. No. 6,523,102, titled "Parallel Compression/Decompression System and Method for Implementation of In-Memory Compressed Cache Improving Storage Density and Access Speed for Industry Standard Memory Subsystems and In-Line Memory Modules" whose inventor is Thomas A. Dye and which was filed Apr. 14, 2000, is hereby incorporated by reference in its entirety as though fully and completely set forth herein.

Computer Architecture of Several Embodiments

Figure 1:
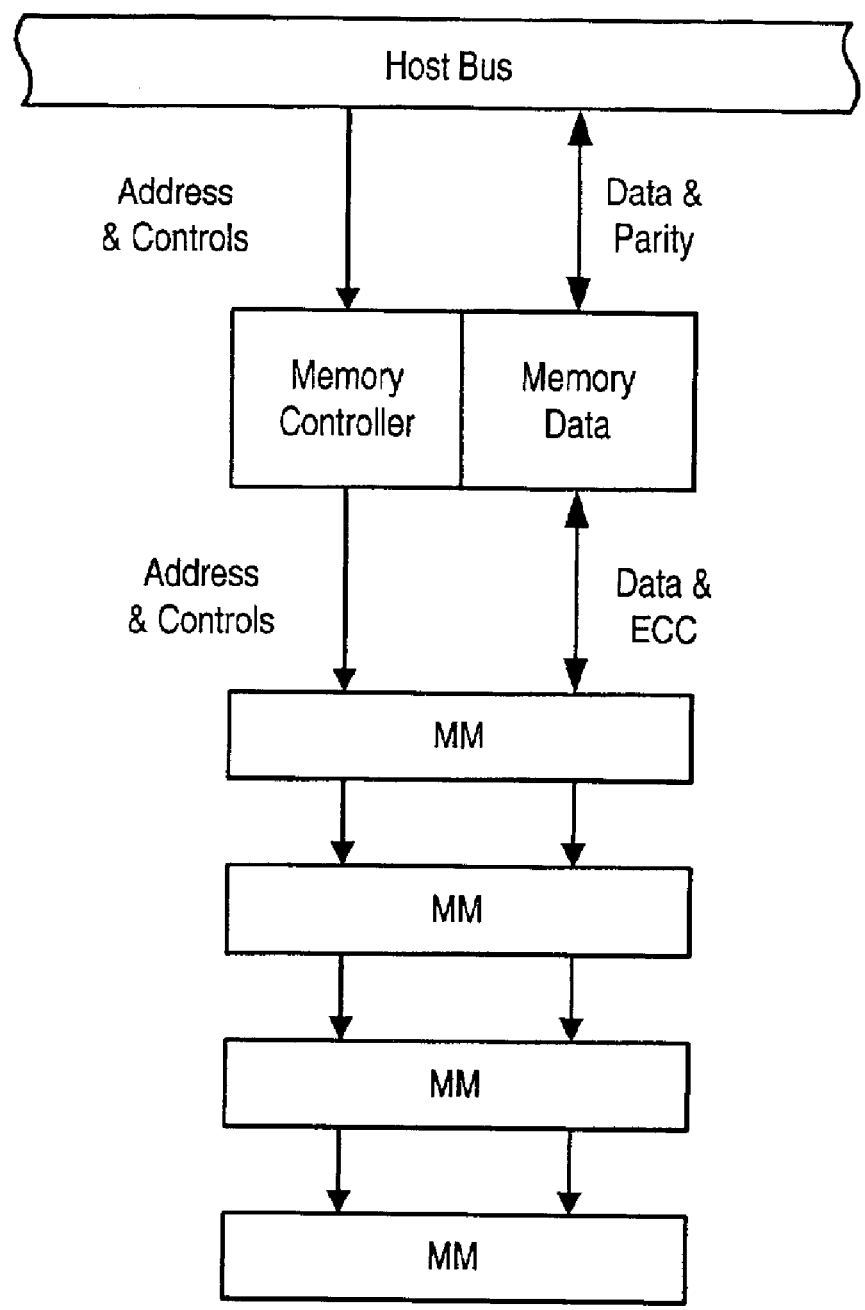
FIG. 1 is a block diagram illustrating a prior art system memory configuration.
Figure 2B:
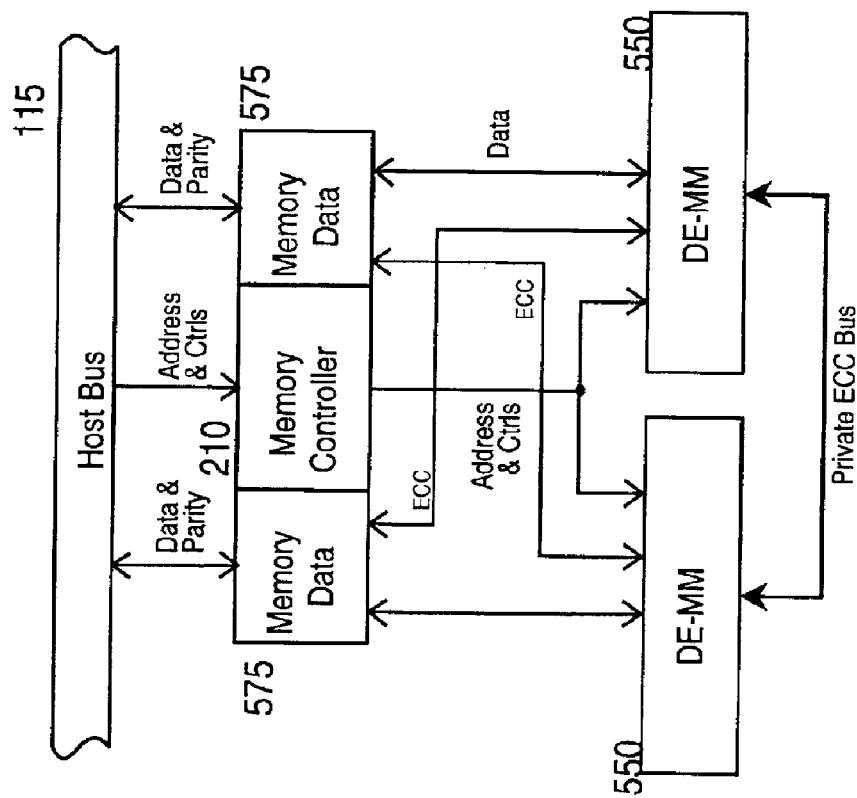
FIG. 2b illustrates the integration of additional DE-MMs in order to increase performance and/or operate on larger bus widths not compatible with a single DE-MM according to one embodiment.
Figure 2A:
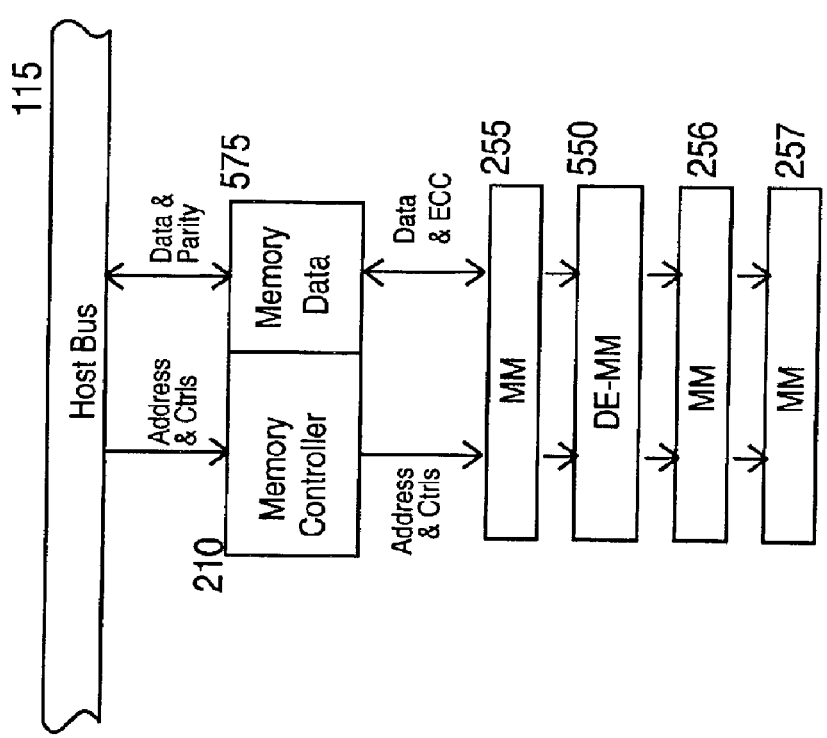
FIG. 2a illustrates the integration of one DE-MM with other standard memory modules within system memory according to one embodiment.

FIGS. 2a and 2b—The Integration of DE-MMs with Other Memory Modules

FIG. 2a illustrates that in one embodiment of a memory system using a single DE-MM 550. Alternate embodiments may assume a plurality of DE-MMs 550 and/or other memory modules to match the bus and performance requirements. For example, FIG. 2b illustrates the use of two DE-MMs 550 and the proper Error Detection and Correction (ECC) for controlling two parallel data buses. During installation (e.g. system startup), the DE-MM driver 500 detects the number and location of DE-MMs 550 in the system, and then initializes the memory subsystem for either single or multiple DE-MM operation as appropriate. Driver 500 may also be able to deactivate an active device on a DE-MM 550, thus making the DE-MM behave like a "normal", non-device enhanced memory module. Driver 500 may also be able to activate an inactive device on a DE-MM 550, for example, if the functionality of the device is required by one or more application executing on the system and the device has previously been deactivated, was not activated at startup, or has gone into "sleep" mode after a period of non-use.

FIGS. 3a and 3b—Physical Layout of One Embodiment of a DE-MM

FIGS. 3a and 3b show a board assembly drawing of one embodiment of a DE-MM 550 where FIG. 3a illustrates the front of the module and FIG. 3b illustrates the back of the module. By way of example, the DE-MM 550 illustrated in FIGS. 3a and 3b includes a compression/decompression circuit (device), also referred to herein as a compactor chip. For the purpose of this disclosure, a DE-MM 550 with embedded compression/decompression device may be referred to as a Compression-enabled Dual-Inline Memory Module (C-DIMM). FIGS. 3a and 3b illustrate one embodiment of the C-DIMM 550 that is a 256 MB registered DIMM that is compliant with the Intel PC100 or PC133 specification. Alternatively, other embodiments may be designed for larger and/or smaller registered memory modules or different form factors or specifications. Additionally, in other embodiments, C-DIMMs may comprise the compactor chip 250A embedded on Rambus or Double Data Rate DRAM devices. Other embodiments may include different DRAM population options and memory types such as those proposed in the JEDEC (Joint Electron Device Engineering Council) standard. In addition, other embodiments may include a mix of these memory types on multiple different memory module standards.

Some embodiments may include custom configurations where high-speed compression is used to store compressed pages or other application data directly into a dynamically allocated compressed page area or allocated regions of the system memory. Such alternate embodiments may be integrated into CORE logic (North Bridge), CPU devices, PCI or AGP boards or discrete components that use high-speed compression and decompression and which are mounted onto the system board or subsystem boards.

Figure 4A:
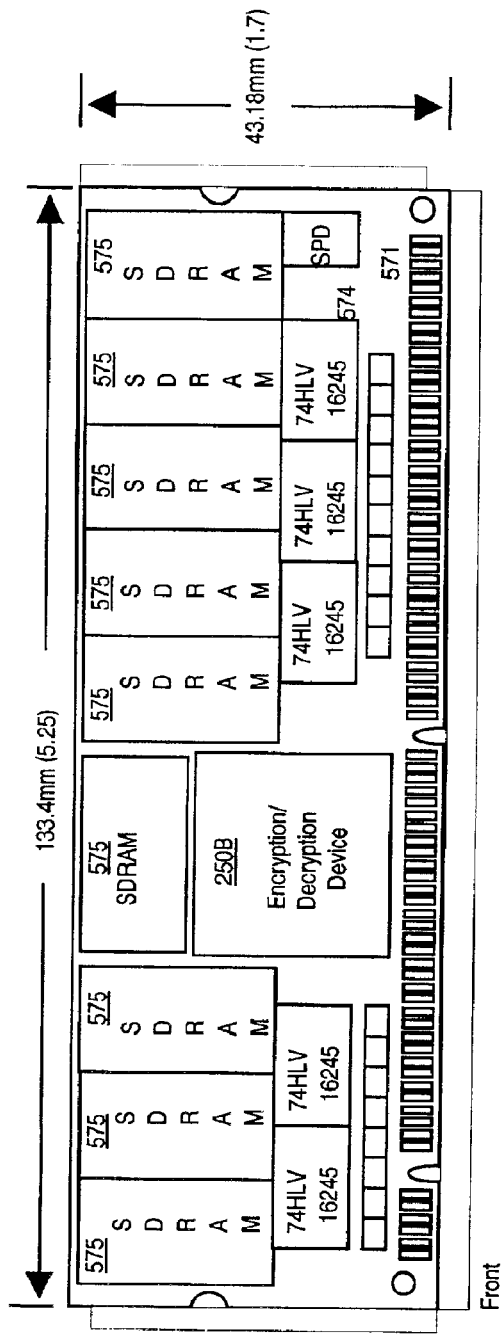
FIG. 4a shows one embodiment of a DE-MM in which an ASIC encryption/decryption device is mounted on the front side of an industry standard memory module.
Figure 4B:
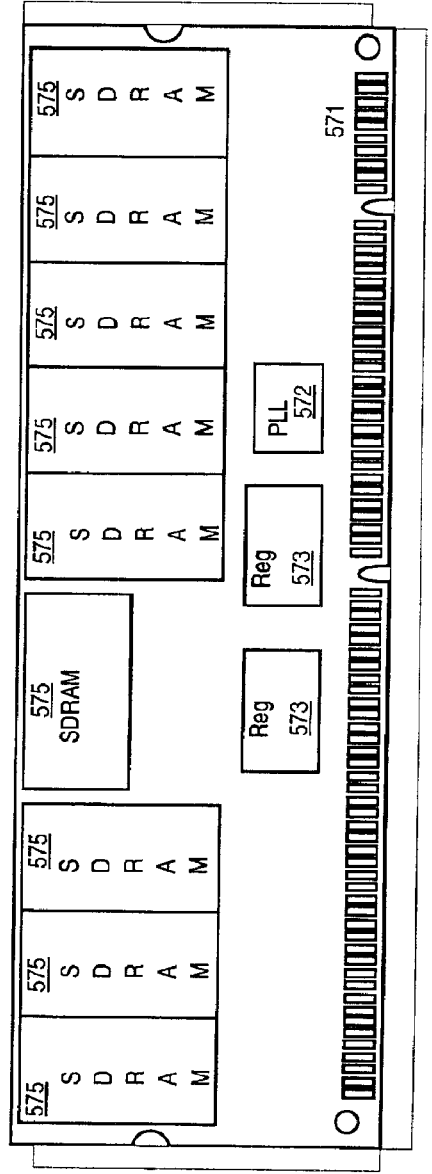

FIGS. 4a and 4b—Physical Layout of Another Embodiment of a DE-MM

FIGS. 4a and 4b show a board assembly drawing of another embodiment of a DE-MM 550 where FIG. 4a illustrates the front of the module and FIG. 4b illustrates the back of the module. By way of example, the DE-MM 550 illustrated in FIGS. 4a and 4b includes an encryption/decryption circuit (device). FIGS. 4a and 4b illustrate one embodiment with the encryption/decompression device embedded on a 256 MB registered DIMM, which is compliant with the Intel PC100 or PC133 specification. Alternatively, other embodiments may be designed for larger and/or smaller registered DIMMs or different form factors or specifications. Additionally, in yet other embodiments, the encryption/decryption device 250B may be embedded on Rambus or Double Data Rate DRAM devices. Other alternate embodiments may include different DRAM population options and memory types such as those proposed in the JEDEC (Joint Electron Device Engineering Council) standard. In addition, alternate embodiments may include a mix of these memory types on multiple different memory module standards.

Figure 5:
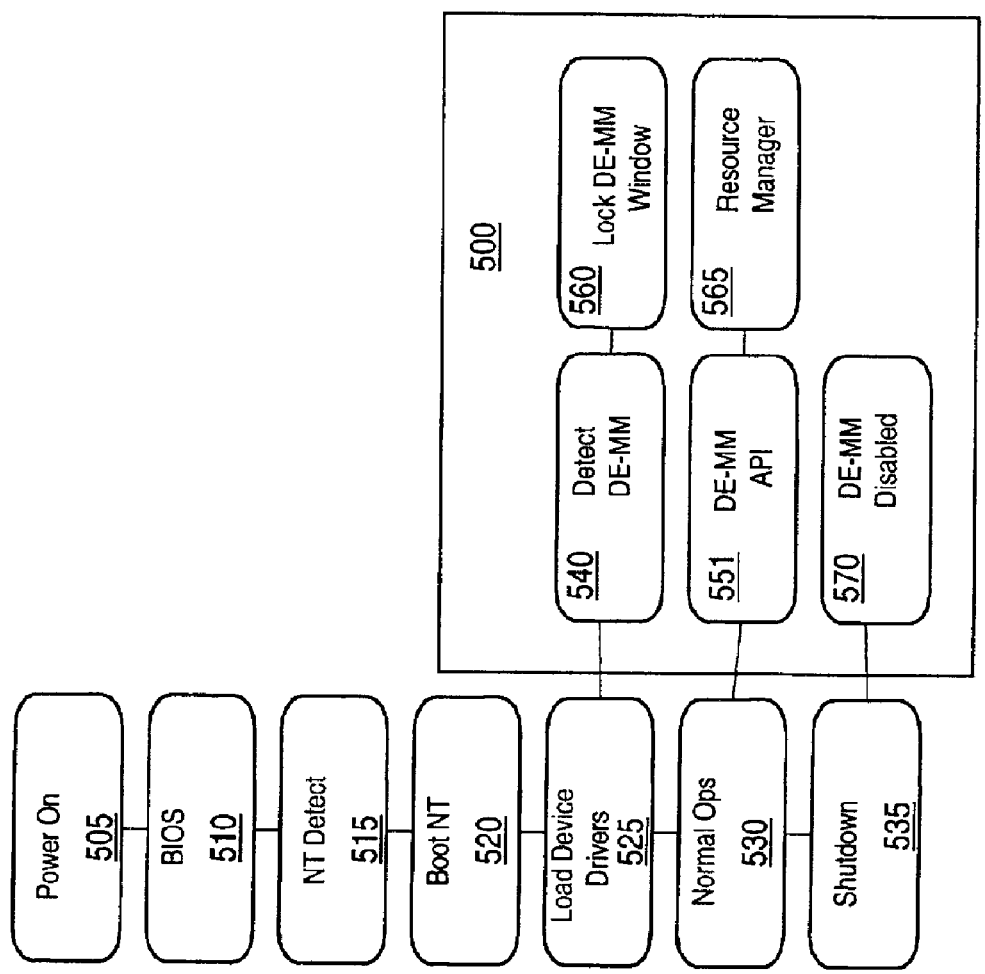
FIG. 5 illustrates the process and operation of one embodiment of a DE-MM driver including the initialization of the DE-MM within the system software normal mode of operation.

FIG. 5—A Computer System with a DE-MM and DE-MM Driver

FIG. 5 illustrates one embodiment of a software architecture that may include several software modules for programming (e.g. detecting and configuring) and operating one or more DE-MMs 550 in a computer system. Note that embodiments of the software architecture as illustrated in FIG. 5 may be implemented in systems that may include one or more DE-MMs 550 of other types such as the encryption/decryption devices as illustrated in FIGS. 4a–4b, or combinations of two or more other types of DE-MMs 550.

A software module as illustrated in FIG. 5 may be called or invoked by one or more other software modules, and the various software modules may pass information necessary to program or control the DE-MM 550 to one or more other modules. The flow of FIG. 5 represents one possible programming flow of the system and the additional software that may be used to operate the DE-MM 550. The embodiment of the programming flow as indicated in FIG. 5 includes the installation, enabling and/or disabling of the DE-MM 550 and the device 250 located on the DE-MM 550. Software sequences 505 through 535 are the normal boot, initialization and shutdown procedure for a prior art computer system without installation of the present invention. Additional software as indicated in blocks 540 through 570 of FIG. 4 may be added to control the DE-MM 550 initialization (power-on 505 through load drivers 525), operation (normal ops 530) and exit (shutdown 535) operation.

FIG. 5 shows an embodiment for the Microsoft Windows NT 5.0 operating system. Alternatively, other operating systems such as various versions of the Unix, Linux, Novell, BeOS and Macintosh operating systems may have similar procedures of operation.

At power-on 505 of the system, the device 250 may be disabled such that any writes or reads to the DE-MM 550 will be handled by the SDRAM on the DE-MM 550. In alternate embodiments, such as where Rambus Inline Memory Modules (RIMMs) are used and the system is used on a RIMM module, the system BIOS may enable the device 250 such that the device 250 uses the aperture window equivalent to the address range of a single memory device instead of a smaller aperture such as the DE-MM module. Thus, the DE-MM 550, prior to initialization by the DE-MM driver 500, may operate the same as a normal industry standard memory module. This transparent action allows any boot memory testing or alternate device driver installation to proceed without any interference from the DE-MM 550.

The BIOS 510 is executed by the CPU or, if multiple CPUs are present, by the master CPU of the Symmetric Multiprocessing (SMP) system. Then the system software, e.g., "NT detect" 515, detects the components of the system and builds a system configuration log. The operating system then boots as indicated by the Boot NT 520 block of FIG. 4.

The device drivers are then installed. According to one embodiment, when the device driver 500 for the DE-MM 550 is installed, the driver 500 may detect the DE-MM 550 by sending a novel "wakeup sequence" to the DE-MM which, when successfully completed, enables the device 250 to begin responding to the driver 500. The device 250 may not respond to normal memory read and write operations to the memory subsystem 200 prior to proper initialization of the DE-MM 550. During the wakeup sequence, the DE-MM 550 may be recognized as a device-enhanced memory module. Also during the wakeup sequence, one or more aspects of the system memory implementation (error detection and correction scheme, memory interleave method, etc) may be identified, and the DE-MM may be initialized to operate within the system memory implementation. After initialization, the DE-MM 550 may be enabled to perform the one or more functions provided by its one or more embedded devices 250 in the system. The wakeup sequence is thus important to operation of the DE-MM 550.

In one embodiment, the wakeup sequence comprises a series of writes to a 16K-byte non-cacheable area of memory. When this sequence is played to a normal memory module, without the device 250, the same data written will be returned during a read. When the wakeup sequence is played to a DE-MM 550, the data may be returned in a different order, compressed, or otherwise altered, or other data may be returned, to indicate the device 250 is present and operational, and the DE-MM 550 is awake and ready for programming. For example, using 8 byte writes, the driver could send "C-DIMM", "Compactor", "con, Inc.", "ive Sili", "Interact", but when the data is read back from the DE-MM 550 it may return "Interactive Silicon, Inc. Compactor C-DIMM", indicating the address location of the device 250 is in the memory subsystem; i.e., that a device 250 is present.

The Error Detection and Correction (ECC) data for the writes and the reads at this point are identical because the device 250's ECC generation logic may not have properly configured at this point. Thus, the wake up and identification of the DE-MM may use the same ECC codes echoed back into the system memory controller 210 to avoid error correction or detection, which may interrupt the CPU causing system errors. Up to the point where the DE-MM driver 500 detects and enables the DE-MM aperture, the DE-MM 550 may appear as a normal memory module. According to one embodiment, when the proper wakeup response has been received, the driver 500 configures the ECC in the device 250. The driver 500 may configure the ECC in the device 250 by playing an ECC learning sequence. The ECC learning sequence may comprise a series of data writes followed by a series of check writes to ensure the ECC learning circuit in the device 250 has matched the ECC that is currently used in the memory controller device 210. This novel approach allows data modified by the DE-MM 550 (e.g. compressed data, if the DE-MM is a C-DIMM) that may include altered ECC check bits to match the expected ECC of the system memory controller 210. This is an important step, considering that modified (e.g. compressed) data read from the device 250 buffers may cause errors due to the ECC scheme used by the system memory subsystem 200.

Once the device 250 is properly configured to use the ECC scheme of the memory subsystem 200, the driver 500 may choose to read the hardware version number and/or part number of the particular DE-MM 550 device 250.

The present configuration may use a dynamic aperture or window for reading and writing of data and control register loads and stores. The driver 500 may set a dynamic aperture address of the dynamic aperture once the device 250, or plurality of devices 250, is located within the system memory map. Preferably, the device 250 uses a dynamic aperture in the system memory map so that the aperture address can be set to an alternate address. This may be desirable to provide lockdown memory areas where the device 250 previously was not located to software and other devices. Thus, the aperture or window of operation for control and data that is transferred between the system memory controller 210 and the device 250 can be relocated to anywhere within the memory map during the boot and initialization process.

During additional configuration, the driver 500 preferably activates or deactivates the device 250 by a write to an internal control register, and may set sleep mode and error value timer registers. Thus, the device 250 may go inactive and power down if not used or if the system sees a soft boot or system reset. In one embodiment, the device driver 500 may move the aperture window or disable the compression engine at any time. A wakeup password may be set by the device driver 500 to wake up the device 250 if it has timed out without a soft boot during normal operation. The final configuration may be an end of initialization or exit instruction that activates the DE-MM 550 for normal operation of the device 250. The driver may repeat this procedure for other DE-MMs 550 within the system memory subsystem 200 or alternate memory subsystem.

Once the DE-MM aperture window is locked down and assigned, the DE-MM 550 may be used to support industry standard applications and operating system compression APIs. Any access by other drivers or software to the locked down device 250 aperture window may receive a general protection fault and would fail the system as in normal prior art system protection mechanisms. Once configured, the DE-MM 550 is active in the system and is considered to be in the "normal" mode of operation, because the DE-MM driver 500 may be called, for example through an application interface to the driver 500, by installed filter software or application software under control of the driver 500 resource management 565 software.

In alternate embodiments, multiple DE-MMs 550 may be installed in the system. For example, when additional compression throughput is required in a system using the compression/decompression capabilities provided by a C-DIMM 550, multiple C-DIMMs may be installed in the system. When multiple DE-MMs 550 are installed, one or more drivers 500 may support and manage serialization of requests to the DE-MMs, for example, compression requests to multiple C-DIMMs.

FIG. 6—DE-MM Logic

Figure 6:
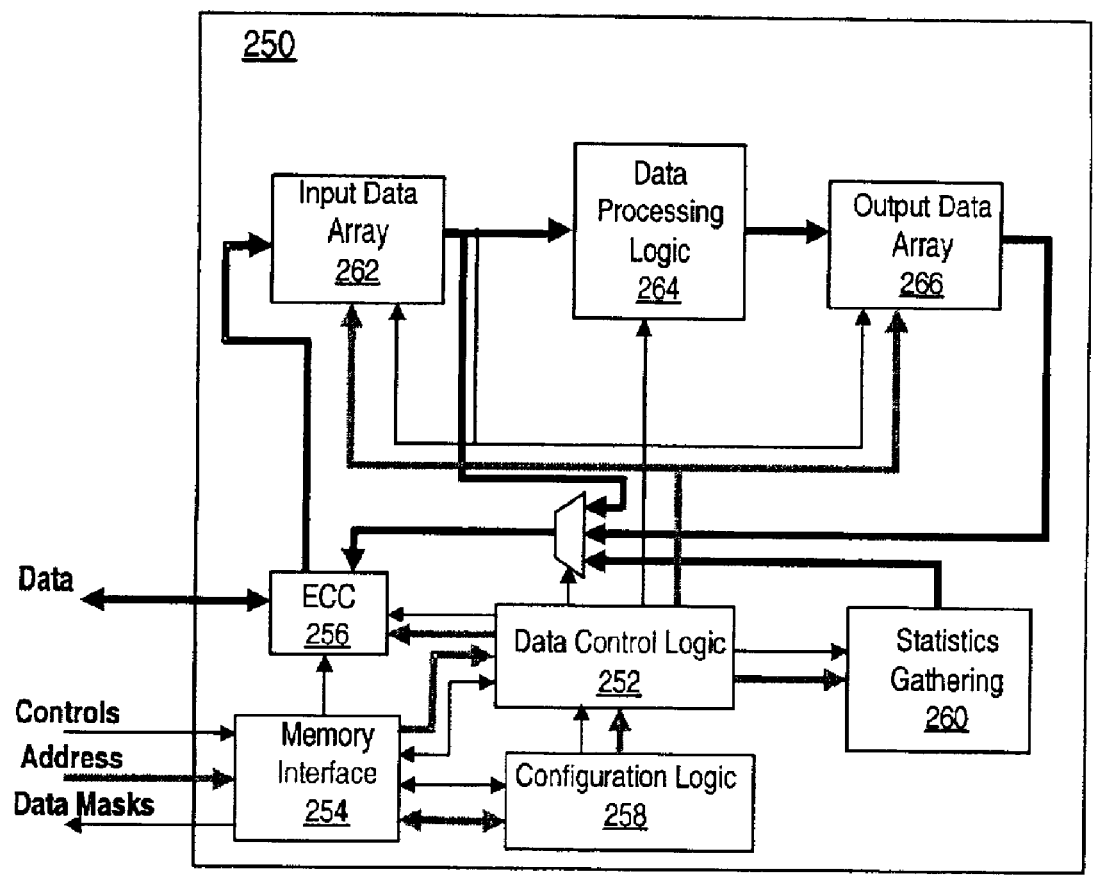
FIG. 6 is a block diagram illustrating the logic of a device embedded on a DE-MM according to one embodiment.

As illustrated in FIG. 6, a device 250 embedded on a DE-MM 550 may be divided into one or more logic blocks. The logic blocks may include, but are not limited to, data processing logic 264 (e.g. encryption/decryption and/or compression/decompression logic) input and output arrays 262 and 266, memory module (e.g. SDRAM) interface 254, ECC interface logic 256, data control logic 252, and configuration logic 258. Some of these blocks are described below.

The data control logic block 252 is preferably responsible for directing all data traffic through the DE-MM embedded device 250. Prior to initialization, or when in sleep mode, all data and commands are preferably routed to the configuration data block 258. After the configuration block 258 recognizes the appropriate wakeup sequence, the fetch, destination and address signals from the interface logic preferably indicate any commands that this logic should handle. Inputs to the data control block 252 may include the command, destination and address signals, along with data and error information from the interface logic 254. In addition, some signals from the configuration logic 258 may be used to indicate the wakeup phase to the data controller 252 so that the data controller 252 can direct the data appropriately. Outputs may include a register address for accessing register and other data values across the system, and addresses and controls for various components such as the data multiplexor and input and output buffers 262 and 266.

In one embodiment, the memory module interface 254 may be responsible for snooping the memory module control signals, recognizing commands addressing the DE-MM memory space, and driving the data byte masks to the memory modules as required on reads from the DE-MM memory. This block may recognize commands and data destined for the device 250, and forward them to the proper controller for handling. This logic will determine which of the DE-MM memory regions the driver 500 is addressing. If system interleaving is done on multiple memory modules in the system, the driver 500 must adjust its access addresses accordingly so that each of the DE-MM memory blocks appears contiguous to this logic.

This block may operate in several modes. One mode occurs prior to the end of the first phase of the wakeup sequence, or while in sleep mode. In this mode, all writes seen by this memory module may be passed through (e.g. as register store (reg_store) commands) to the configuration logic 258. The written data may be used by the configuration logic 258 to recognize the wakeup sequence. In one embodiment, the configuration logic 258 may indicate the recognition of the wakeup sequence by dropping the Sleep signal. This interface block must save the indicated address of the stores as the start block address. If the Sleep signal is active and the start block has been saved previously, then only reads and writes to the exact start block address may be passed to the configuration logic 258 (e.g. as register fetch (reg_fetch) and reg_store commands). Once awake, this block begins operating in its second mode.

The ECC logic 256 may include configuration data that can be accessed or updated through one or more registers (e.g. an ACC0REG register). The configuration data may include the check bit configuration information as well as the Syndrome Bit correction array data.

The configuration block 258 is preferably responsible for the wakeup sequence recognition, and device 250 configuration during the phases of the wakeup sequence. Once awake, this logic preferably controls the sleep timer and notifies the interface block when the device 250 should enter sleep mode. This block may also control the onboard EEPROM signals that allow the device 250 to control access to and programming of the memory module EEPROM. The configuration logic block 258 may also include one or more registers used during the wakeup sequence and/or used to hold the DE-MM configuration information and other information such as serial number.

Figure 7A:
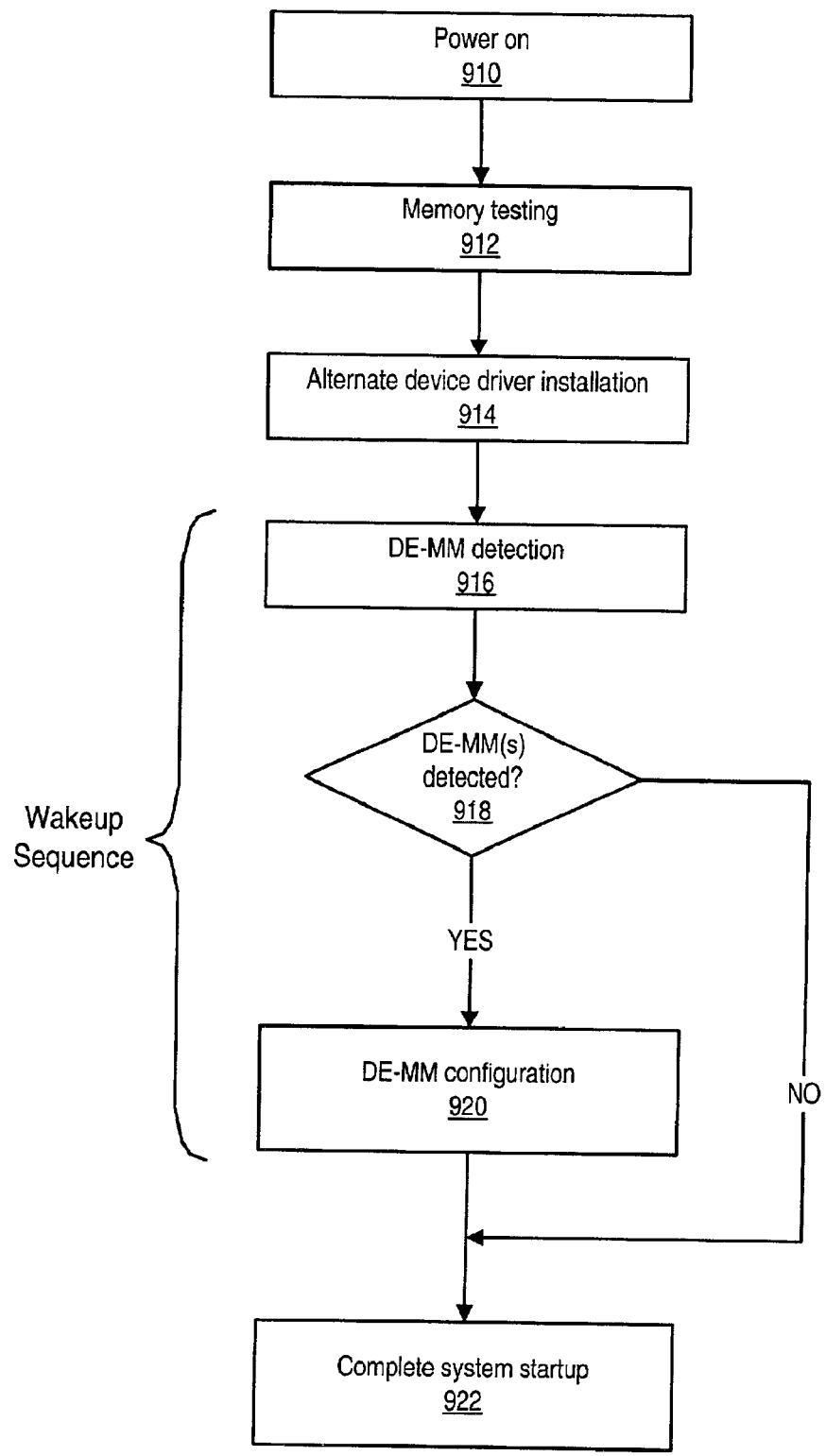
FIG. 7a is a flowchart illustrating the startup and configuration of one or more DE-MMs during system startup according to one embodiment.

FIG. 7*a*—Startup and Configuration of a DE-MM

FIG. 7*a* is a flow diagram illustrating one embodiment of a system startup process including a wakeup sequence for a DE-MM device driver 500. In the wakeup sequence, the device driver 500 attempts to recognize and configure one or more DE-MMs 550 installed in memory module slots in the system. The DE-MMs 550 may be any of various types, for example, C-DIMMs.

At power-on 910 of the system, the devices 250 on the one or more DE-MMs 550 are preferably disabled so that any writes or reads to the DE-MMs will be handled by the SDRAM. This preferably allows any boot memory testing 912 or alternate device driver installation 914 to proceed without interference from the DE-MMs. In addition, the Serial Presence Detect (SPD) interface may be configured to pass through necessary data, including Clock data, at power on.

Next, when installed, the device driver 500 for the DE-MMs 550 may play a DE-MM wakeup sequence. During the wakeup sequence, the driver 500 may attempt to detect any installed DE-MMs 550 as indicated at 916 and, if any DE-MMs are detected as indicated at 918, perform DE-MM configuration as indicated at 920 to configure any detected DE-MMs and enable the devices 250 on the DE-MMs 550 to respond to driver 500 commands during normal system operations.

The wakeup sequence of the one or more DE-MMs 550 performed by the driver 500 preferably includes a series of commands to the SDRAM memory in one or more phases that may allow the driver 500 to recognize and operate with the one or more installed DE-MMs 550 and vice versa. These phases may include, but are not limited to, DE-MM detection 916 and one or more phases of DE-MM configuration 920 including ECC Configuration, ECC Test, Interleave Initialization, Interleave Test and Final Configuration phases. To begin the wakeup sequence, the driver 500 preferably allocates a block of memory at least as large as the start block size (a system cache line). This block is preferably allocated on a memory module that is suspected of being a DE-MM 550. In one embodiment, the block is aligned on an 8K-byte boundary.

The first four phases of the wakeup sequence, including detection 916 and the ECC Configuration, ECC Test, and Interleave Initialization phases of configuration 920 may be completed within a time period from the start of the wakeup sequence, preferably within 524,228 bus clocks (about 5 mS at 100 MHz), or the device 250 on the DE-MM 550 preferably resets to the start of the wakeup sequence (DE-MM detection 916). Alternatively, as it may not be necessary to repeat DE-MM detection 916, the sequence may be reset to the beginning or within one of the other phases of the sequence, for example, to the ECC Configuration phase of configuration 920. In addition, the last two phases of configuration 920 (Interleave Test and Final Configuration) may be completed within a time period, preferably 400,031,744 bus clocks (about 4 seconds at 100 MHz) of the start of the fifth phase or, if the wakeup sequence does not complete in the time period, the device 250 on the DE-MM 550 preferably resets to the start of the wakeup sequence (DE-MM detection 916). Alternatively, as it may not be necessary to repeat DE-MM detection 916, the sequence may be reset to the beginning or within one of the other phases of the sequence.

As mentioned above, the wakeup sequence 916 may detect one or more DE-MMs 550 of the type(s) supported by the driver executing the wakeup sequence. If two or more DE-MMs 550 are detected, separate structures may be maintained for each DE-MM 550 detected for configuring the DE-MMs. Note that each DE-MM 550 preferably has its own memory map area as depicted in FIG. 6. Thus, though each DE-MM 550 may operate in the same memory model, each DE-MM 550 may have its own unique address space, offsets, etc. that are detected and configured during the wakeup sequence 916.

One or more types of DE-MMs 550 may be installed in a system. Preferably, a device driver 500 for each type of DE-MM 550 will execute a wakeup sequence to detect and configure installed DE-MMs of its particular type. Alternatively, a single DE-MM device driver 500 may execute one or more wakeup sequences to detect and configure DE-MMs of different types.

In some embodiments, at least a portion of the procedures performed by the DE-MM device driver 500 may be implemented in hardware. For example, a memory controller may include logic to perform at least a portion of the wakeup procedure. Thus, a device driver 500 for a DE-MM 550 as described herein may be implemented in software, in hardware, or in a combination of software and hardware.

In one embodiment, the embedded device 250 on the DE-MM 550 may include logic for performing at least a portion of the procedure. For example, the device 250 may include Error Correction and Detection (ECC) logic that responds to input from the device driver 500 by learning an ECC scheme of the system. In another embodiment, the DE-MM 550 may include logic external to the embedded device 250 that performs at least a portion of the procedure.

After configuration 920 completes, the startup of the system may be completed as indicated at 922.

Unintended activation may occur if a software program executing on the system requests and receives a page of memory on the DE-MM 550 and inadvertently plays the series of commands of the wakeup sequence to the SDRAM memory in its entirety and in the correct order to that page. This may undesirably perform the wakeup sequence and activate the DE-MM 550, and future stores to and fetches from this area of memory may result in incorrect data. Therefore, the series of commands of the DE-MM wakeup sequence is preferably sufficiently cryptic and extensive that the likelihood of unintended activation is extremely low. In addition, "abnormal" behavior is preferably included in the wakeup sequence that may only be generated by driver or kernel code as opposed to user code. An example of abnormal behavior in user code may be 8-byte non-cacheable stores, which may be included as part of the wakeup sequence.

Handling Sleep Mode

In one embodiment, if the sleep timer value, preferably kept in a DE-MM status register, is set to a value other than all 1's, then a timer will decrement every cycle until a valid access is received by the DE-MM 550, or the timer reaches a minimum limit (e.g. 0). A valid access is any fetch from the input buffer 262, output buffer 266, or any valid register, or a valid store to either the input buffer 266 or any register. On a valid access, the timer may be reset, for example, to the sleep timer value in the DE-MM status register.

If the timer is decremented to 0, the embedded device 250 on the DE-MM 550 preferably enters sleep mode. In sleep mode, the device 250 preferably does not respond to any fetches or stores to the DE-MM memory range except for phase 1 of the wakeup sequence when played at address 0 of the start block (wakeup sequence). The device 250 preferably minimizes power requirements while in sleep mode, for example by turning off clocks to unneeded logic if possible.

In one embodiment, the driver 500 may check the DE-MM 550 to see if the device 250 has entered sleep mode at any time. To do this, the driver 500 preferably stores 8 bytes of 0's in a Sleep register on the DE-MM 550, and then fetches that same register (the driver may first ensure the line is not cached). If the data fetched is all zeros, then the device 250 is in sleep mode, and the wakeup sequence is preferably played prior to any command or register fetch. If anything but all zeros is returned, then the device 250 is not in sleep mode, and is ready for access. The sleep timer is preferably reset by the store and fetch to the Sleep register if the device 250 is awake, so the driver 500 has the full timer allotment to make the next access.

Resetting the DE-MM

The wakeup sequence as described in FIG. 7a may be performed at system startup time and/or at other times during system operation. In one embodiment, one or more DE-MMs 550 may not be recognized and configured at system startup time. In one embodiment, after startup, a DE-MM 550 may be reset back to a power-on state; for example, driver 500 may reset the DE-MM. In one embodiment, commands may be available for resetting the DE-MM 550 back to a power-on state. These commands may include a series of Reset commands that are preferably issued and received in a correct order. For example, two Reset commands (Reset command 1 and Reset command 2) may be provided. If the correct reset commands are received, e.g. the two commands (1 and 2) and are received in the correct order (e.g. with step 2 following step 1), the DE-MM 550 preferably resets all blocks to a power-on state. To re-enable a reset DE-MM 550 or to enable a DE-MM 550 that was not enabled at system startup time, at least a portion of the wakeup sequence may be performed to enable the DE-MM 550. In the preferred embodiment, the entire wakeup sequence may be performed for the DE-MM 550 to be enabled or re-enabled.

Figure 7B:
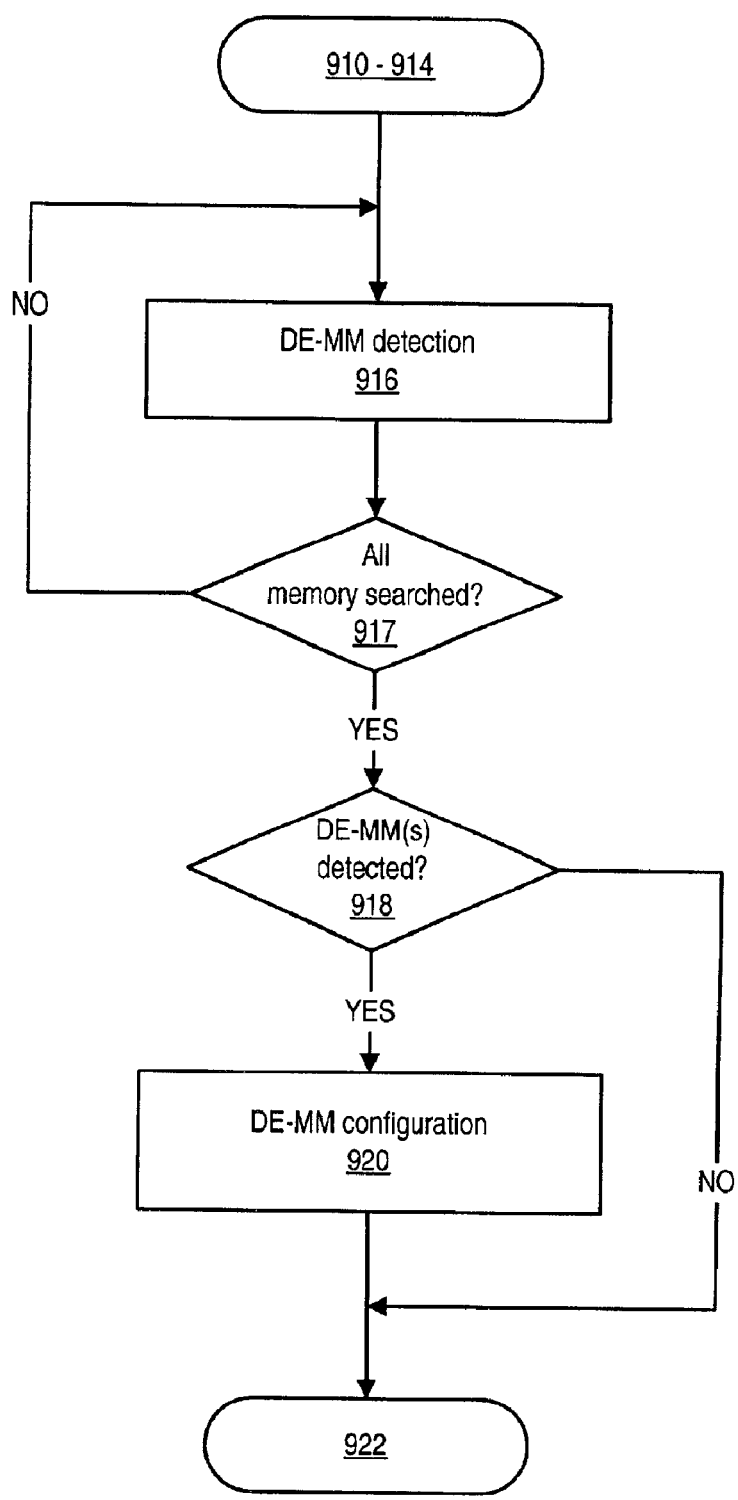
FIG. 7b is a flowchart illustrating a method of detecting one or more DE-MMs prior to configuring the detected one or more DE-MMs according to one embodiment.

FIG. 7b—Detecting DE-MMs Prior to Configuring the Detected DE-MMs

FIG. 7b is a flowchart illustrating one embodiment of the wakeup sequence as illustrated in FIG. 7a in which one or more DE-MMs 550 are detected among memory modules in memory space prior to configuring any of the detected DE-MMs. After all of memory is searched as indicated at 917, then, if any DE-MMs 550 were detected as indicated at 918, DE-MM configuration 920 as described in FIG. 7a is performed on all detected DE-MMs 550.

Figure 7C:
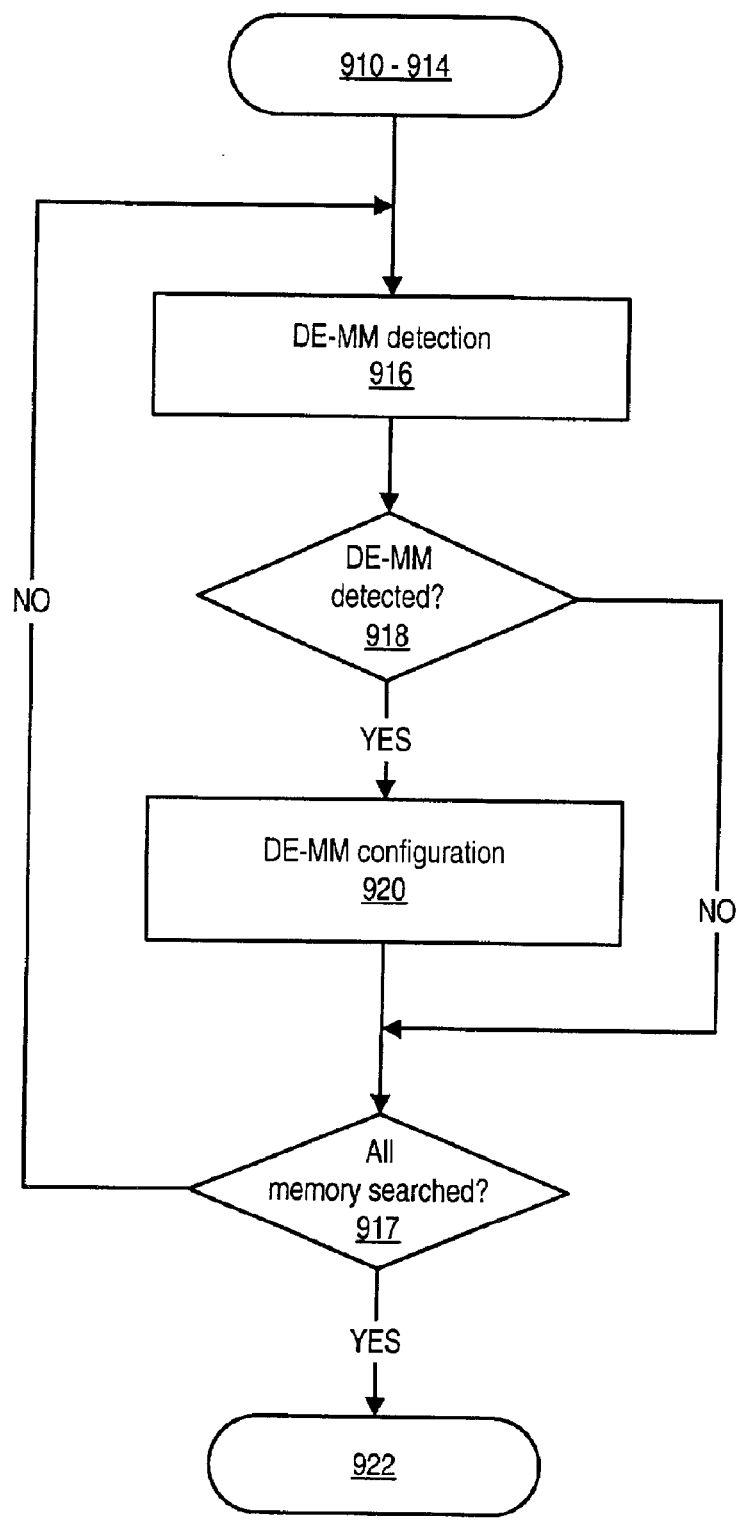
FIG. 7c is a flowchart illustrating a method of detecting and configuring each of one or more DE-MMs according to one embodiment.

FIG. 7c—Detecting and Configuring Each DE-MM

FIG. 7c is a flowchart and illustrating another embodiment of the wakeup sequence as illustrated in FIG. 7a in which the wakeup sequence searches for a DE-MM 550 as indicated at 916 and, if a DE-MM was detected as indicated at 918, configures the detected DE-MM as indicated at 920. If there is more memory to be searched as indicated at 917, the wakeup sequence returns to search for the next DE-MM 550. After all of memory is searched as indicated at 917, then the method continues to complete system startup 922.

Figure 8:
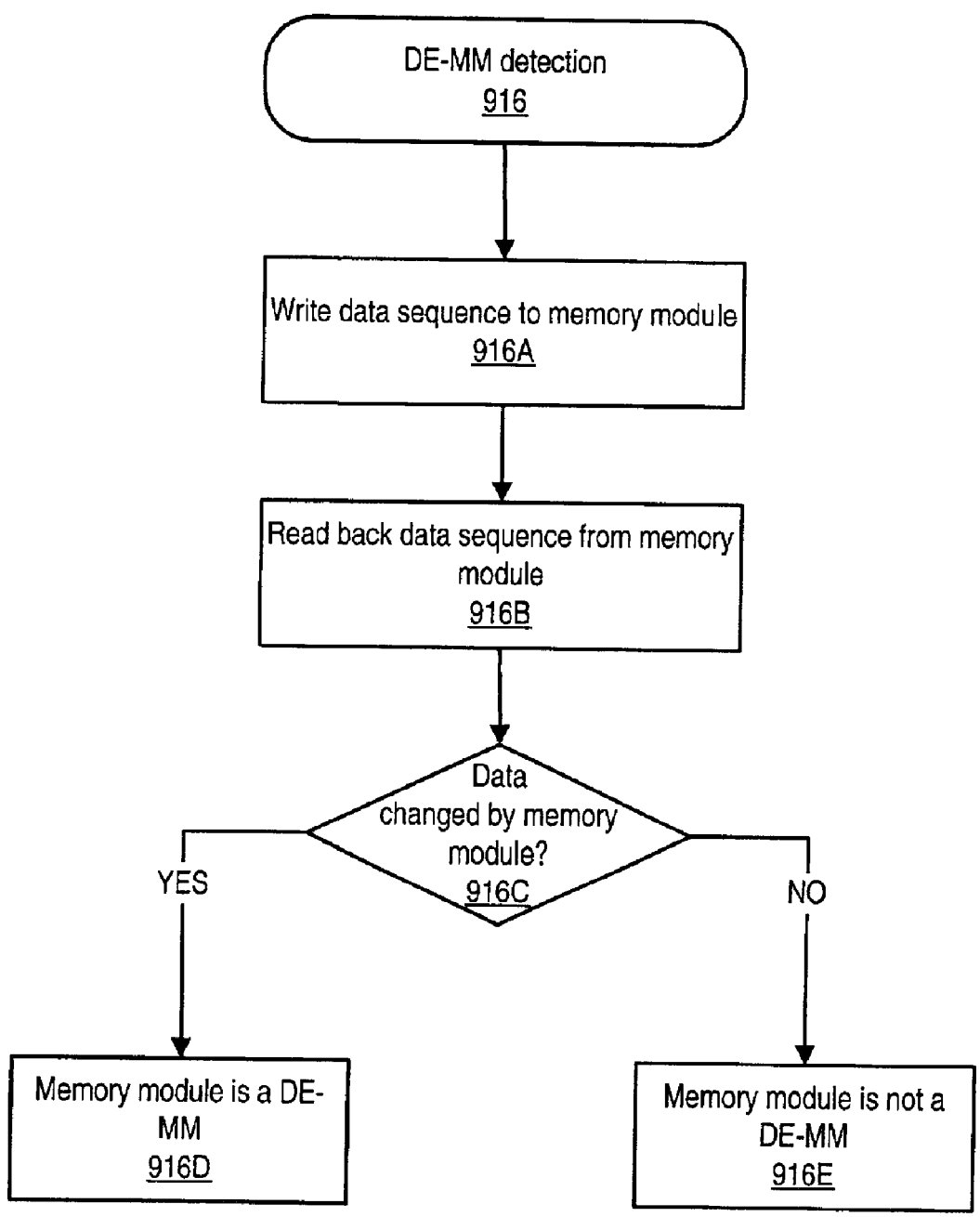
FIG. 8 is a flowchart illustrating a method of detecting the presence of one or more DE-MMs among one or more memory modules according to one embodiment.

FIG. 8—Detecting the Presence of One or More DE-MMs

FIG. 8 is a flowchart expanding on DE-MM detection 916 of FIGS. 7a–7c and illustrates one embodiment of a method for detecting the presence of DE-MMs 550 among memory modules in memory space. During DE-MM detection 916, preferably no data read from the DE-MM 550 is different from what was previously written to the DE-MM because the ECC has not yet been configured. In addition, DE-MM detection 916 is preferably limited to writes and reads to a single cache line in memory because the interleaving of memory, if any, of the system has not yet been discovered.

At 916A, driver 500 may write a series of unique data sequences to memory addresses in memory module memory space to identify one or more DE-MMs 550 among the one or more memory modules installed in the system. These unique data sequences preferably include data such as illegal operations (op codes), invalid text, etc., that are highly unlikely to be duplicated in normal system reads and writes to memory. This makes it highly unlikely that the series of unique data sequences will accidentally occur during normal operation of the system. The memory space to which the data sequences are being written is preferably uncacheable, or caching must be turned off for the memory, to guarantee that the same locations in memory are hit.

At 916B, the driver 500 may read one or more of the data sequences written to the memory addresses at 916A. As indicated at 916C, the driver 500 may determine if the data read at 916B is different (e.g. modified, reordered or replaced) from the data written at 916A. If the data sequence was written to a DE-MM 550, the data will be returned in a different order or otherwise modified to indicate the DE-MM is awake and has received the data. Recognizing that the data is different, the driver 500 identifies the memory module as a DE-MM 550 as indicated at 916D. If the data sequence was written to a normal memory module, the same data that was written will be returned by the read unchanged, and thus the driver 500 recognizes the memory module as a normal, non-device enabled memory module as indicated at 916E.

In one embodiment, in order to guarantee access of memory at different locations, a block of memory may be allocated before each write/read, and the write/read may be performed somewhere within the block. In one embodiment, the allocated blocks may not be deallocated after the write/ read, but instead may remain allocated to insure the next allocate/write/read combination occurs at a new location in memory. This method ensures that all of the memory modules in system memory are tested at least once, for example, in systems with memory management systems that do not allow direct addressing of a known memory address. Another embodiment may use direct addressing of memory addresses, if allowed in the system, to ensure that all memory modules are tested. In this embodiment, the allocated blocks may be deallocated after use.

The following is an example including, but not limited to, a series of steps that may occur during DE-MM detection 916:

Write a series of unique data sequences (for example, eight sequences) to address 0x0 in the selected block.

Read address 0x0 of selected block.

If the last written data is returned unchanged, this is not a DE-MM 550; pick a new block and begin again.

If modified last written data is returned, a DE-MM 550 has been detected; proceed to DE-MM configuration 920.

If an awake status is returned, the memory module was asleep and is already configured. Proceed to the last phase of DE-MM configuration 920 for final configuration, or send End Initialization sequence if only a reset is desired, or continue last command.

In one embodiment, reads and writes during the wakeup sequence 916 may be pipelined through the device 250 on the DE-MM 550 to increase performance during the wakeup sequence. In other words, subsequent reads and writes may be started prior to the completion of previous reads and writes.

Figure 9:
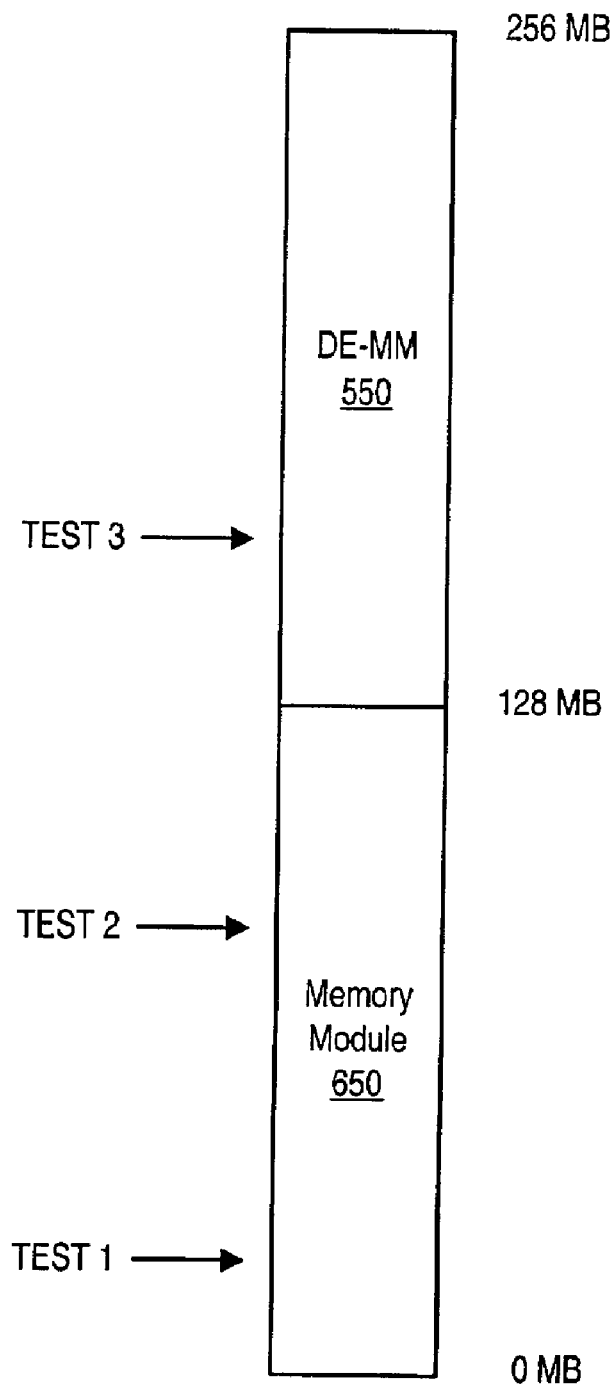
FIG. 9 is a flowchart illustrating a DE-MM configuration and wakeup sequence according to one embodiment of the invention.

FIG. 9—Testing Memory Space for DE-MMs

FIG. 9 is a block diagram illustrating a process of a driver 500 testing memory for the presence of one or more DE-MMs 550 according to one embodiment. In this example, total physical memory space is 256 MB. The first 128 MB of memory space is on memory module 650, and is addressable in the range 0 MB to 128 MB. Address range 128 MB to 256 MB is on the DE-MM 550.

As described in FIG. 8, during DE-MM detection 916, a series of unique data sequences may be written to memory addresses in memory space to identify one or more DE-MMs 550 among the one or more memory modules installed in the system. In test 1 of FIG. 9, a series of unique data sequences is written to a first memory location that falls in the range of memory module 650. When the data is read back from the memory module, it is unchanged, indicating to the driver 500 that the memory written to is not on a DE-MM 550. In test 2, the data is written to a second memory location, and again, when read back, is unchanged. In test 3, the data is written to a third memory location that falls in the memory address range of the DE-MM 550. When read back, the data has been modified. In one embodiment, the data is modified by the DE-MM 550, or alternatively by the device 250 embedded on the DE-MM 550. The data may be modified during the write to the DE-MM 550, during the read of the DE-MM, or during both the write and the read. The driver 500 checks the data when read back and determines that the data has been modified, thus detecting this as a DE-MM 550. The driver 500 may then save the information identifying this address range as being on a DE-MM 550 for later use. The driver 500 may then proceed to the configuration and wakeup sequence 920 as described in FIG. 10.

Memory module memory space on a system may include memory modules (e.g. DIMMs) and DE-MMs 550 in arbitrary order. The DE-MM detection algorithm is preferably of sufficient granularity, and preferably is performed at strategic locations in the memory space, to allow detection and configuration of all DE-MMs 550 in the installation.

Figure 10:
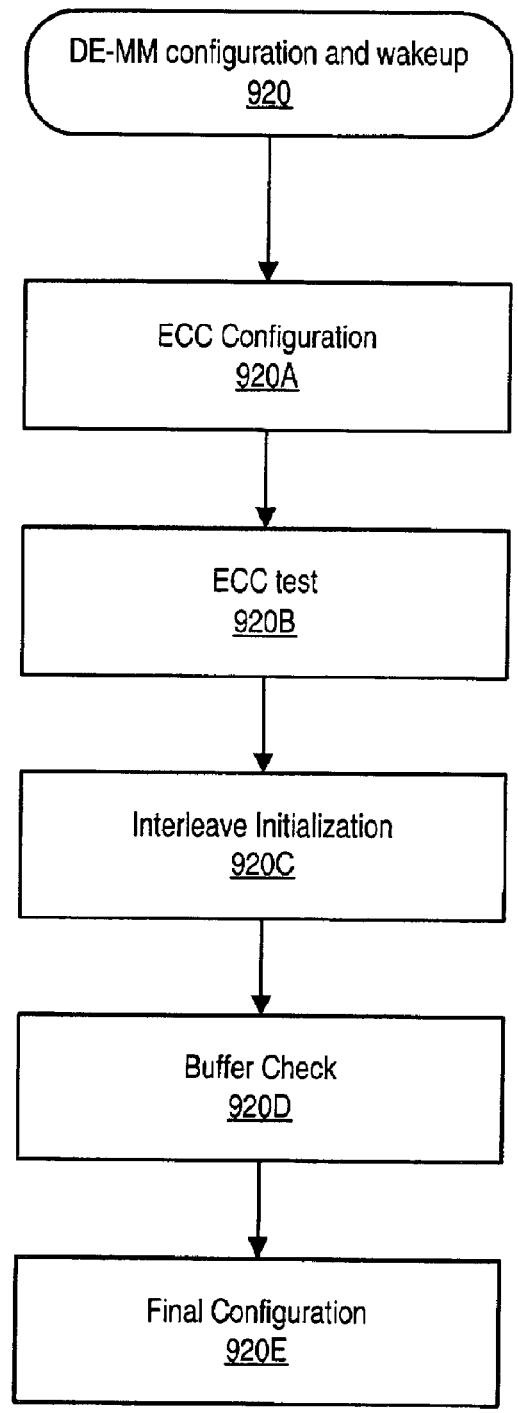
FIG. 10 illustrates a process of testing memory space to detect DE-MMs according to one embodiment.

In one embodiment, as illustrated in FIG. 7*b*, the driver 500 may detect all DE-MMs 550 in the system, then perform the configuration of detected DE-MMs 550 as illustrated in FIG. 10. Alternatively, as illustrated in FIG. 7*c*, the driver may perform the configuration and wakeup sequence as illustrated in FIG. 10 for a detected DE-MM 550 after detecting the DE-MM 550, and then detect and configure the next DE-MM 550, and so on until all DE-MMs 550 within memory module memory space have been detected and configured.

FIG. 10—DE-MM Configuration

FIG. 10 is a flow diagram illustrating the DE-MM configuration 920 of FIGS. 7*a*–7*c* according to one embodiment. DE-MM configuration 920 may be used to configure one or more DE-MMs 550, such as the embodiments depicted in FIGS. 2 and 3, which were detected during DE-MM detection 916. DE-MM configuration 920 may configure independent DE-MMs 550, DE-MMs performing with other DE-MMs (for example, two 64-bit DE-MMs acting together to provide a 128-bit addressable space to increase read and write bandwidth), and DE-MMs acting in combination with one or more other memory modules such as DIMMs (for example, through an interleaving method provided by the memory controller).

When one or more DE-MMs 550 are detected during DE-MM detection 916, the driver 500 may perform DE-MM configuration 920. ECC Configuration, as indicated at 920A, preferably includes a plurality of writes to address 0 of the start block. In one embodiment, there may be one unique write for each of the bits on the data path (e.g. the memory bus), each with the particular bit set (e.g. 1). In one embodiment, there may be one additional write with no bits set (e.g. all bits 0). Thus, in one embodiment with a 64-bit memory bus, there are 65 8-byte writes. These writes preferably allow the device 250 on the DE-MM 550 to learn the ECC Generation algorithm, and to configure itself for generating ECC for the data read from the DE-MM 550, as well as for checking and correcting data written to the device 250. These writes are of specific data and are described below in the section on handling ECC. During ECC configuration 920A, the ECC logic of the DE-MM driver 500 preferably either recognizes a possible ECC scheme or recognizes a valid parity algorithm. Preferably, the DE-MM driver 500 and the DE-MM 550 are then configured for the recognized ECC scheme or parity algorithm. In the case when no valid ECC algorithm or parity algorithm is recognized, the system may actually be in a non-ECC, non-parity system. This situation may be handled at 920B.

At the completion of the configuration for data checking and generation, the driver 500 preferably executes a read to address 0x0 of the start block on the DE-MM 550. The results of the read may indicate the success or failure of the configuration. In one embodiment, the DE-MM 550 preferably returns all zeros if the configuration failed, to some other value if the configuration succeeded. In one embodiment, if the configuration succeeded, all reserved bits in a system status portion of a system configuration register may be set to 1. The system configuration register may also be set to indicate the memory module burst size and the correct ECC versus Parity choice.

ECC Test, as indicated at 920B, preferably includes a set of writes to the start block of arbitrary data. The DE-MM 550 preferably checks this data with its newly configured ECC logic to see if the test conditions are satisfied. There may not be a required number of writes for this test, but a set of writes which is preferably a minimum set is described below in the section on Handling of Error Correction Codes. Preferably, at the completion of the test writes, a read to address 0x0 of the start block may return the SYSREG with all reserved bits in the system status portion set to 1. The ECC and Parity bits in the system status portion will indicate the final ECC/Parity/No Checking choice. No Checking may be indicated if this was determined to be a non-ECC, non-parity system at 920A. Preferably, the read to the start block also indicates the status (e.g. success or failure) of the ECC test 920B. If an ECC configuration failure occurred, the driver preferably restarts the wakeup sequence to retry the configuration. This restart preferably includes an End Initialization sequence or command followed by the Reset Chip command sequence. If continued failures are encountered, then, in one embodiment, the system ECC may be turned off or, in an alternate embodiment, the DE-MM 550 may not be activated.

In one embodiment of a configuration and wakeup sequence 920, interleave initialization may be performed as indicated at 920C. As an example, the system may have routed its address bits such that if programming address 0x1000000 is the start block address, then programming address 0x1000010 is the next cache line. However, if interleaving is present, the next cache line that resides on the same DE-MM 550 may be 1, 2, 4 or more cache lines away from the start block depending on how many memory modules are interleaved. The driver 500 preferably allocates a larger area starting with the start block, and then writes a recognizable, but different value in each of the burst lines in that allocated area. These writes may be to burst lines or 8-byte writes. Following these writes, multiple reads to the start block may return the data in the order stored by the DE-MM 550. These reads may be burst reads or 8-byte reads. Each 8-byte read to the first double word of the start block may deliver the appropriate 8 bytes and increment the fetch pointer to the next burst line (BL). For example, the driver 500 may store 1 in the first burst line (at the start block (SB)), a 2 in next burst line (SB+1BL), a 3 in SB+2BL, and so on to a 512 in SB+511BL. The driver 500 may then begin reading from the start block. If the driver 500 sees 1, 2, 9, 10, 17, 18 . . . returned from these reads, it recognizes that the memory has an interleave of 4 and is interleaved by dual cache lines. In one embodiment, all zeros may be returned if a read to an unwritten cache line occurs (i.e. all the lines seen by the DE-MM 550 have been returned). If all zeros are returned on the first read, then the memory module didn't see any of the 512 writes, and the driver preferably allocates another cache line block to continue the test until the interleave is discovered. In one embodiment, configuration and wakeup sequence 920 may be completed by a read to the SYSREG register at start block+64 bytes.

In one embodiment, the driver 500 may reset the automatically incrementing fetch pointer to zero by issuing another store to the start block any time prior to the SYSREG fetch. This allows the driver 500 to restart configuration and wakeup sequence 920 from the beginning at any time if desired. This store may overwrite the data returned for the first fetch, but the following fetches will return the previously stored data if the data is valid.

At this point, the start of the DE-MM register memory block is preferably the start block address. The driver now preferably writes to a register on the DE-MM to properly set the Input and Output Buffer offsets. Timers in a DE-MM register may also be set, but are preferably not activated until the configuration and wakeup sequence 920 is complete.

Buffer check, as indicated at 920D, preferably includes writing a block of bytes, for example, 4K bytes, into the DE-MM memory input buffer, and reading a block of bytes, for example, 4K bytes, from the DE-MM memory output buffer. If the driver 500 has the correct interleave settings and offset settings, the same data that is written will be read from the DE-MM 550 at the new location. In one embodiment, the writing and reading of the input and output buffer may be totally random, and may not include the entire buffer if the driver 500 is comfortable with the level of checking it has done.

In one embodiment, once the ECC is properly configured, the interleave is determined, and the buffers have been tested, the final configuration as indicated at 920E begins. During final configuration 920E, the driver 500 may read hardware identification values including, but not limited to, hardware version number, chip part number, and memory module serial number to complete the DE-MM configuration. The driver 500 preferably writes to a register on the DE-MM 550 to properly set the sleep mode timer value, the error timer value, and the restart timer value for the DE-MM 550. This may be followed by a write to a DE-MM register to make the driver version available to the hardware or other software in the system. In one embodiment, an end initialization sequence may be sent to the DE-MM 550, which preferably resets DE-MM logic including the device 250 (e.g. the compression/decompression device of a C-DIMM) and arrays, clears all statistics information, and starts timers such as the sleep mode and restart timers. The DE-MM 550 is now prepared for performing its functions, for example, if the DE-MM is a C-DIMM, compression and decompression of data on reads and writes to memory.

Handling of Error Detection and Correction (ECC) on a DE-MM

Figure 11A:
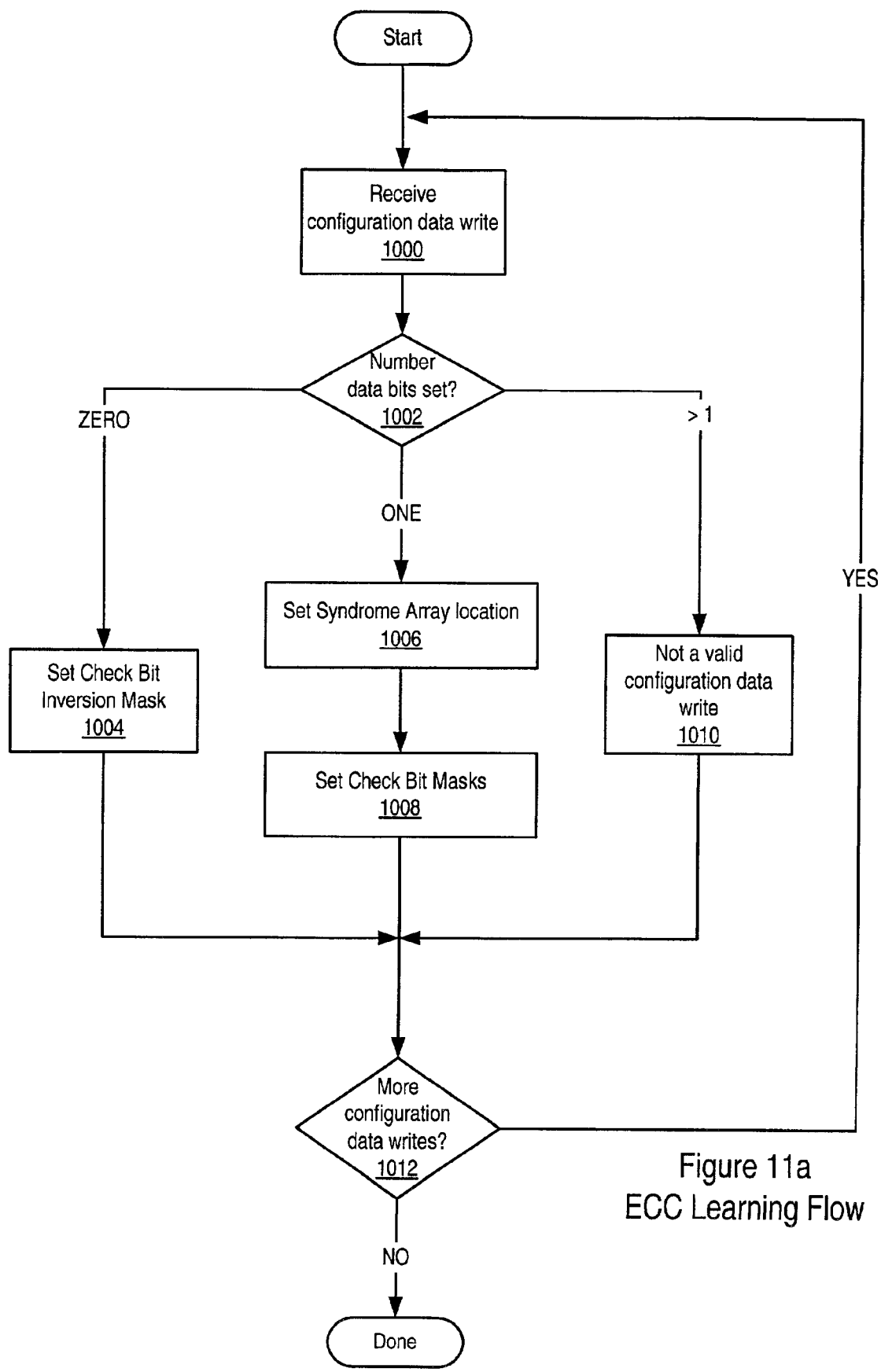
FIG. 11a is a flowchart illustrating a method for learning an error detection and correction (ECC) scheme according to one embodiment.
Figure 11B:
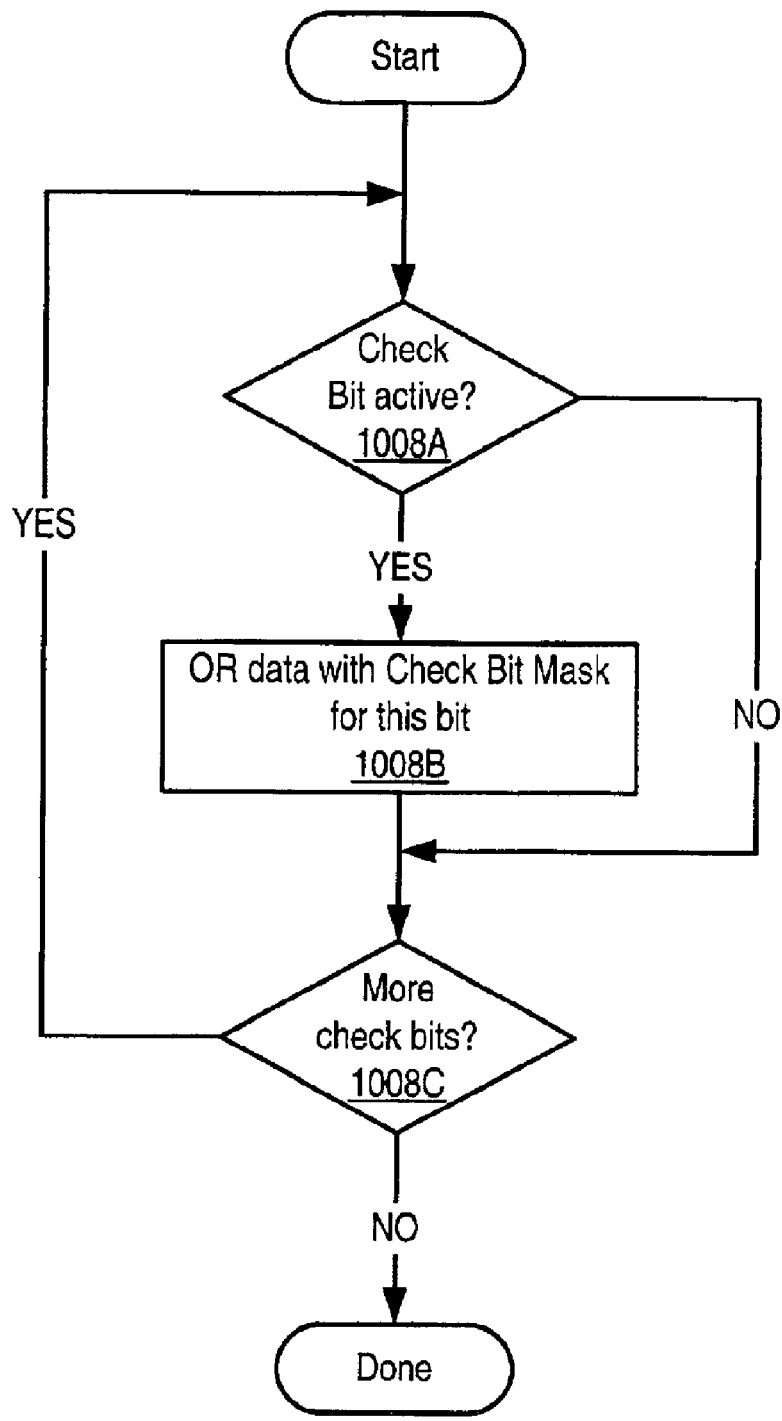
FIG. 11b is a flowchart illustrating a method for configuring Check Bit masks according to one embodiment.
Figure 12:
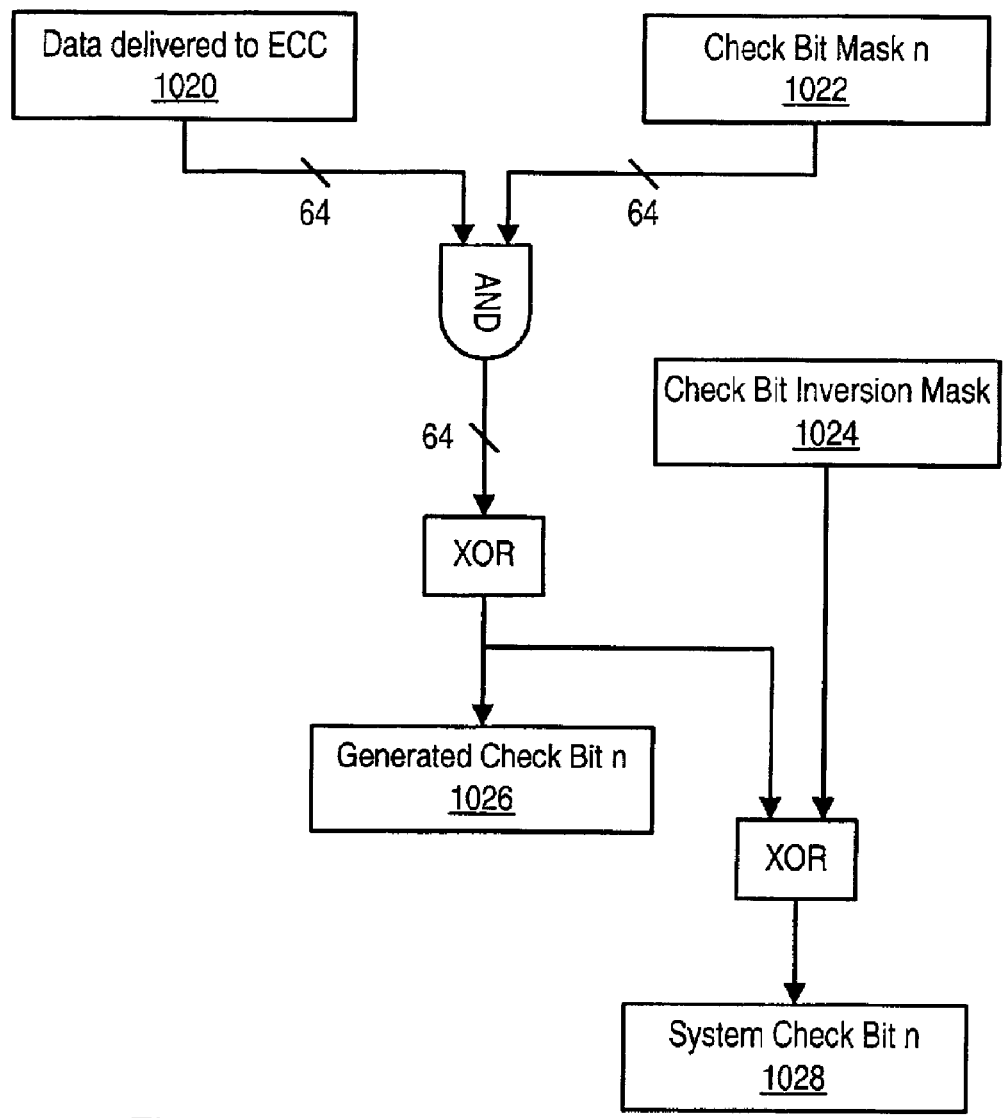
FIG. 12 illustrates logic for generating check bits from received data using a learned ECC scheme according to one embodiment.
Figure 13:
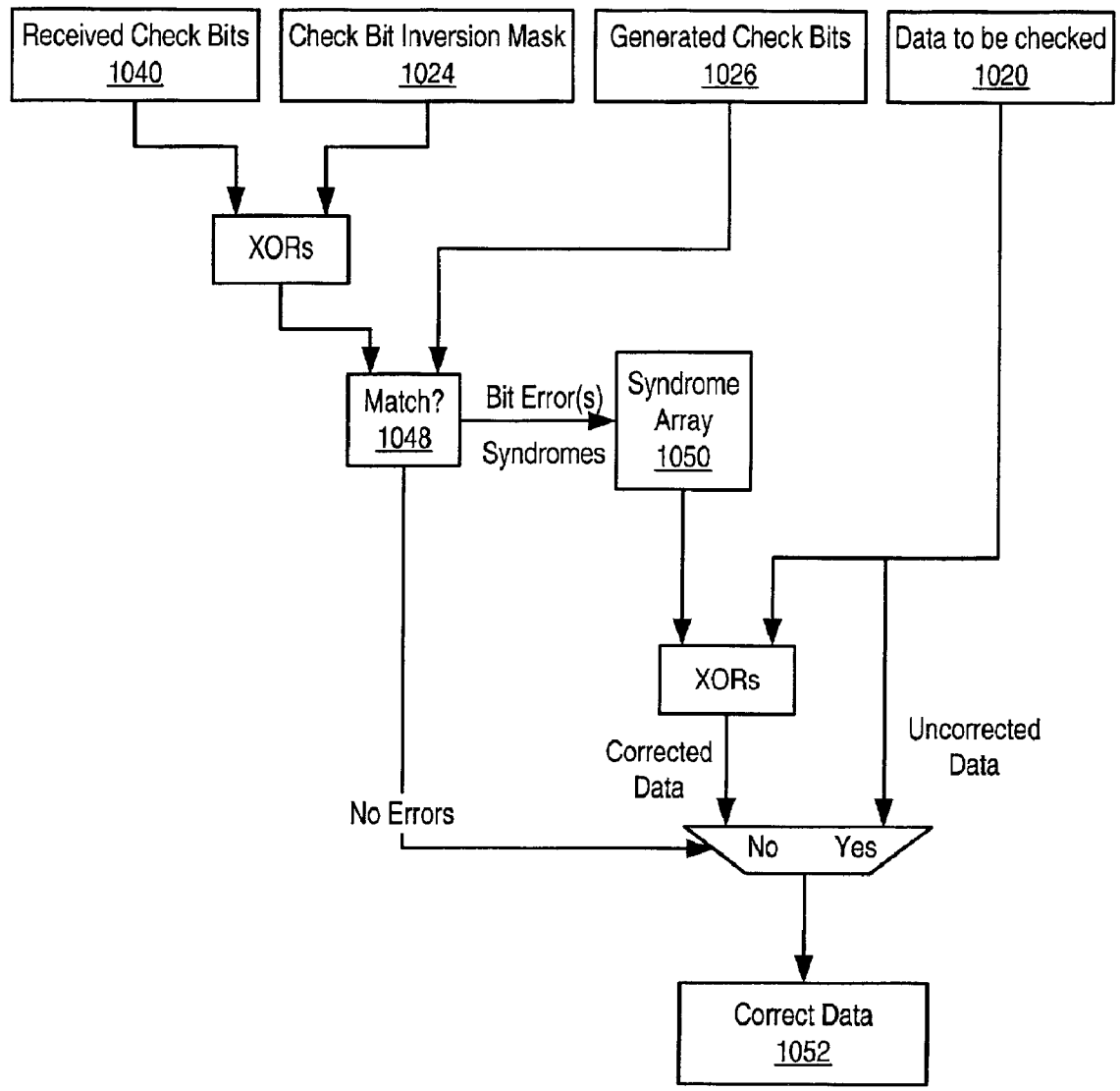
FIG. 13 illustrates logic for checking and correcting received data using a learned ECC scheme according to one embodiment.

The following description and FIGS. 11–13 further describe various aspects of an Error Detection and Correction (ECC) Configuration method as indicated at 920A of FIG. 10.

In some embodiments, reads and writes to the DE-MM memory area must deal with the ECC for the data being transferred to avoid improper single and double bit errors from being reported to the system and possibly resulting in a system shutdown. For stores to the DE-MM memory area, ECC may be discarded, but it may be preferable to check the ECC to verify the correct transmission of data. In some embodiments, on fetches from the DE-MM memory, ECC must be properly generated. In other embodiments, on fetches from the DE-MM memory, ECC may be bypassed through one of several methods.

With systems using ECC for reliably transferring data, it may be desirable to allow multiple memory masters (i.e. a component, such as a memory controller or DE-MM 550, that may become master of the memory bus) to transfer information that is unique to each of the memory masters. This requires each memory master to have the ability to generate the correct ECC bits for the data that is unique to it. Thus, a DE-MM 550 should be able to verify the correctness of the data sent from other memory masters and to correct errors found in the data. Further, to allow portability to other systems that may use different encoding of the ECC check bits, in some embodiments, the DE-MM 550 may be able to learn and generate the ECC bits required by the system in which it is installed.

A Hamming error correction code matrix or scheme typically consists of a tree of exclusive ORs (XORs) that combine the data bits to generate a set of check bits, where each unique combination of check bits represents an ECC code. These check bits may be concatenated on the data transfer so the receiving entity can store these check bits and/or use them to determine the correctness of the received data. The check bits may additionally allow the receiving entity to correct some number of data bit errors that may have occurred in the data. Each of the check bits may be generated by XORing some or all of the data bits. By generating the proper number of check bits, and by using the proper data bits for their generation, the ECC code allows for checking and correction. There are well-understood methods for selecting the number and location of the data bits that should be combined to form proper ECC codes. However, the ECC codes used in one design are not required to be the same those used in another design to provide the same checking and correction capability. Different designs may choose to use different correction levels, data bit selections, and/or data bit inversion, any of which would result in different ECC codes being generated for the same data value.

ECC was designed to correct errors due to memory module failures (cell, row or in some cases chip failures). These failures may occur because the data may be stored for long periods and is subject to decay, noise and cosmic interference. ECC may also correct failures on the bus for any single bit. However, such failures are much less likely to occur in a properly designed motherboard. Data transferred from DE-MM memory may not be stored in the memory module (e.g. SDRAM) arrays, so it may not be subject to the failure causes of the memory modules. Therefore, some embodiments may bypass ECC for these DE-MM memory accesses. In one embodiment, parity may be used to catch any data bus errors that may result in a retry of the fetch or in system notification of a board failure.

Generating the correct ECC is a concern because there are multiple standards for the ECC algorithm. Many system memory components such as memory controllers use a Single Error Correct, Double Error Detect, Nibble Error Detect (SEC, DED, NED) algorithm. However, even with the same algorithm requirements, choices for the actual calculation of check bits is likely to be different, resulting in transposed, inverted or otherwise different check bits for identical data on different implementations of system memory components such as memory controllers.

Possible solutions for handling ECC on a DE-MM 550 design include, but are not limited to, the following:

Inclusion of Configurable ECC on Chip—It is possible to include an ECC scheme on the DE-MM 550 that has limited configurability for both the input data and check bits, and the output check bits. This preferably provides the ability to generate the correct ECC bits for all fetches from the DE-MM memory area. This may also require changes to the BIOS to set the correct ECC configuration on the DE-MM prior to any memory testing. If BIOS changes are not possible, jumpers may be used to indicate the memory controller used in the system. This solution may require correct wiring on the motherboard of all data bits and check bits.

Inclusion of Single Manufacturer ECC on DE-MM—If a particular ECC scheme used by the memory controller and/or other memory masters is used on the DE-MM 550, then changes to the BIOS may not be required. In this case, the likelihood of being able to function in a system with a different manufacturer's memory controller with ECC active may be very low. This solution may require correct wiring on the motherboard of all data bits and check bits.

Memory Controller Change to bypass ECC for DE-MM Fetches—Some solutions are possible if the memory controller can make minor changes without requiring the inclusion of the entire DE-MM data block. On such change may be for an additional signal from the DE-MM 550 that indicates to the memory controller when it should not check the ECC for the data being read. Another solution may be an address range in which, when accessed, the ECC is bypassed. In both of these cases, Parity may be substituted for the ECC. Alternate solutions may be used based upon other memory controller designs.

No ECC—This solution requires that the ECC for the entire system be turned off, if used. This may be a viable option for some implementations. New servers are required to have ECC, so this is not an option for servers. For low-end PC solutions, this may be an option.

Configurable/Learning ECC scheme—A "learning" ECC generator may be used by assuming that all ECC check bits are generated by an XOR tree of the data bits (e.g. 64 data bits). During (or alternatively, after) the wakeup sequence (before any reads of unwritten data to the DE-MM 550), a plurality of data writes to the DE-MM 550, for example, 65 data writes, may be used to teach the DE-MM 550 the ECC scheme. In one embodiment, the writes may include one write with all data bits set to 0, and a set of writes each with one bit set. In this set of writes, there is preferably one unique write for each bit of the N (e.g. 64) data bits of the memory bus with the particular bit set to 1. The accompanying check bits for each of the plurality of writes to the DE-MM 550 are preferably set to the ECC code for the data bits of the write in accordance with the ECC scheme being learned. This preferably allows the method to determine which check bits are affected by each data bit. For example, the writes might include (0x0, 0x1, 0x2, 0x4, 0x8, 0x10, 0x20 . . . ). In one embodiment, the writes may be in arbitrary order. In one embodiment, after all of the plurality of writes has been received by the DE-MM 550 and the ECC configuration completed, a series of checking writes are preferably sent to measure the success of the ECC configuration. The ECC code of the write with all data bits set to 0 may be used for inverting check bits as required in some ECC schemes.

If a standard XOR matrix (e.g. Hamming matrix) was not used to generate the ECC check bits, this solution may not be successful. In addition, if the check bits are wired from the memory controller to data bits on the memory module, this method may fail. However, wiring the check bits to data is not a good design practice because it prevents non-ECC parts from ever being used in the system, and therefore, may never be encountered.

The preferred embodiment of the DE-MM 550 may use embodiments of the Configurable/Learning ECC scheme as described above. Logic on the DE-MM may be configured to use the learned ECC scheme to generate ECC data for data sent to the memory controller from the DE-MM 550. In one embodiment, the logic may also be configured to allow the DE-MM 550 to check the ECC data of data written to the DE-MM and to correct the data on a single bit error, or to set an appropriate error bit or bits if a multiple bit error is detected. Preferably, the data is not stored if a multiple bit error occurs. In one embodiment, if a status register on the DE-MM 550 is set to a particular value (e.g. the Report ECC bit is set the status register), a multiple bit error may be forced on the next fetch from the DE-MM 550 if a multiple bit error is detected for any input data. Other embodiments are possible and contemplated that may be configured to correct some multiple bit errors if allowed by the learned ECC scheme.

One embodiment of a DE-MM 550 may determine the number of check bits used in the system in which it is installed and use this information to learn and use various ECC codes on the system. In one embodiment, a DE-MM 550 may include a mechanism for learning an ECC scheme, a mechanism for generating the ECC check bits for data using the learned ECC scheme, and a mechanism for checking received data for errors and correcting the received data if a bit error or errors is detected and the ECC scheme allows the correction.

After learning the ECC for a system, a DE-MM 550 may receive data with ECC check bits generated using the system's ECC scheme. The DE-MM 550 may then use the ECC check bits to determine the correctness of the data bits and, if one or more bits are in error, to correct the one or more bits if allowed by the ECC scheme. The checked and, if necessary, corrected data may, if required, be modified by the device 250 on the DE-MM 550 (for example, compressed by a compression/decompression engine, if this is a compression/decompression-enabled DE-MM). The data, whether modified or unmodified, may then be stored in DE-MM memory, returned to the sender, forwarded to another component or device (e.g. to a disk drive for storage in modified format), or a combination of one or more of the above may be performed.

Additionally, data stored in DE-MM memory may be read from the DE-MM 550 and, if the data was previously modified, the modification may be reversed (for example, if a compression/decompression-enabled memory module (C-DIMM), the data may be decompressed if it was compressed before being stored). The DE-MM 550 may then use the learned ECC scheme to generate appropriate ECC check bits for the data and send the data, with generated check bits, to one or more other components or devices that also use the ECC scheme.

FIGS. 11a and 11b are flowcharts illustrating one embodiment of a method for learning an error detection and correction (ECC) scheme in a system including memory. The method sets up various data and/or structures used during ECC processing, including check bit masks 1 through n, a syndrome array, and a check bit inversion mask. In FIG. 11a, a teaching memory master sends a configuration data write that is received by the learning DE-MM 550 as indicated at 1000. The configuration data write is checked to see how many data bits are set as indicated at 1002.

Some ECC schemes may invert some or all of the check bits to allow certain check bit combinations for data of all zeros or all ones. If there are no data bits set in the data write (i.e. all data bits are 0), then the check bit inversion mask may be set as indicated at 1004. In one embodiment, he teaching memory master sends the learning DE-MM 550 a data write of all zeros, with the check bits set for the data write of all 0's in accordance with the ECC scheme being learned. The check bits for the data write are saved for use as the check bit inversion mask. The check bits for the data write of all 0's may be used as the check bit inversion mask because, for a standard XOR tree in a Hamming code matrix, all check bits should be zero when all the data bits are zero. Thus, any set check bits indicate an inverted bit.

To program the check bit masks and the syndrome array, a set of writes (e.g. configuration data writes) with only one of the data bits set (i.e. one data bit is 1, all others are 0), and the proper check bits set for the data write may be used. In one embodiment, there is one data write for each of the N data bits of the data interface (e.g. memory bus). For example, in a 64-bit data interface, the teaching memory master may send 64 writes including:

0x0000000000000001
0x0000000000000002
0x0000000000000004
0x0000000000000008
. . .
0x8000000000000000

In one embodiment, these writes may occur in arbitrary order.

When it is determined that a 1-bit data write was received as indicated at 1002, the method sets the syndrome array location for this write as indicated at 1006. For each of the above 1-bit active configuration data writes, the position of the set data bit in the data interface is stored in the syndrome array. In one location, the position is stored at a location indicated by the check bits received with the data write. In one embodiment, the active data bit position may be saved as a mask, or alternatively as an encoded pointer. The preferred embodiment may use an encoded pointer to reduce the size of the syndrome array. For example, for the data 0x4000 with check bits 0x4A, the learning hardware may save the encoded pointer 0x0E (decimal 14) in the syndrome array at a location indicated by the code 0x4A. The encoded 0x0E indicates that the set data bit in the data (0x4000) is at the fourteenth bit position, with the least significant bit being at position 0. Other embodiments may use other methods of generating encoded pointers for bit positions. In one embodiment, the syndrome array may be used to locate the positions of data bits in error when checking received data. In one embodiment, if the check bits (i.e. ECC code) of a received data write indicates a multiple bit error, then accessing the syndrome array with the ECC code does not produce a valid bit position, and thus indicates a multiple bit error.

For 1-bit data writes the check bit masks may be set as indicated at 1008. One embodiment of a method for setting check bit masks is further illustrated in FIG. 11b. In one embodiment, if there are more than one data bits set in the configuration data write, then this may not be a valid configuration data write as indicated at 1010, and thus no ECC configuration is performed for the invalid configuration data write.

As indicated at 1012, the method as described in 1000–1010 may be repeated for each bit in the interface, plus once for the all-zero configuration data write, to fully configure the learning DE-MM 550. For example, a 64-bit interface may require 65 data writes to fully configure the learning DE-MM 550.

FIG. 11b illustrates one embodiment of a method for configuring check bit masks. For each configuration data write with only one data bit active, the learning DE-MM examines each check bit as indicated at 1008A and, if the check bit is active (i.e. set to 1), ORs the check bit mask with the received data as indicated at 1008B. For example, if the data is 0x04000 with check bits 0x4A, the learning hardware ORs check bit masks 1, 3, and 6 with the data 0x04000. The remaining check bit masks are unchanged for this data write.

FIG. 12 illustrates one embodiment of logic for generating N check bits from received data where M data bits are combined to generate each check bit. In one embodiment, M is 64. In one embodiment, N is 8. Check bits 1 through N for the M data bits received on the data bus are generated. Each check bit n (where n is this check bit's position or number) may be generated by using a check bit mask 1022, as generated by the method of FIGS. 11a–11b, to select the correct data bits from received data 1020 to be XORed to generate the particular check bit 1026. In one embodiment, there is one check bit mask 1022 for each check bit 1026 to be generated, allowing for any data bits to be used for that check bit. The received data 1020 and the check bit mask n 1022 may be ANDed before the XOR. The AND results in any data bits in received data 1020 that are not to be included in this check bit generation to be set to zero, and thus not affect the XOR. When the output bits (e.g. 64 bits) of the AND are XORed, the generated check bit 1026 will be 1 if an odd number of bits in the output bits of the AND are set (e.g. 1) and 0 if an even number of bits in the output bits of the AND are set. So, for example, if exactly one of the 64 output bits from the AND is set, then the generated check bit 1026 will be 1. As another example, assuming 16 data bits:

| Data: | 0xFFA2 |
| Check bit mask n: | 0x0012 |
| AND results: | 0x0002 |
| XOR results (check bit n): | 1 |

If the data 1020 delivered to the ECC logic is being sent from this memory master (e.g. this DE-MM 550) to another memory master, checking may not be required. The generated check bit n 1026 may then be XORed with the check bit inversion mask 1024 generated by the method of FIGS. 11a–11b to produce system check bit n 1028. The system check bits 1028 may be concatenated with the data bits and sent to another memory master. The generated check bits 1026 may also be used to verify the correctness of the data received from another memory master.

FIG. 13 illustrates one embodiment of logic for checking and correcting received data 1020 by comparing the received check bits 1040 with the generated check bits 1026 to see if an error in the data has occurred. The received check bits 1040 may first be XORed with the check bit inversion mask 1024 and the results compared with the generated check bits 1026. If the check bits match the results of the XOR, no error has occurred, and the data 1020 is output as correct data 1052 without modification. However, if the check bits do not match, one of the data bits 1020 needs to be corrected. The bit to be corrected can be determined by using the received check bits 1040 to look up the bit position in the syndrome array 1050 generated by the method of FIGS. 11a–11b. The bit to be corrected may then be inverted to generate correct data 1052.

To conclude, by implementing the software and/or hardware described above in FIGS. 11–13, a memory master or other component (e.g. a DE-MM 550) may learn an ECC code from a teaching memory master that uses software and/or hardware to send a plurality of configuration data writes to the learning memory master. Data may then be readily exchanged with the proper checking and correction of the data. Thus, a component that implements these methods may not require complete prior knowledge of an ECC code to be implemented. Also, a component may be designed to communicate with another component that may use a different ECC algorithm without requiring modification of the other component. The methods as described in FIGS. 11–13 may be implemented in hardware, software, or a combination thereof. The order of method may be changed, and various steps may be added, reordered, combined, omitted, modified, etc.

Figure 14:
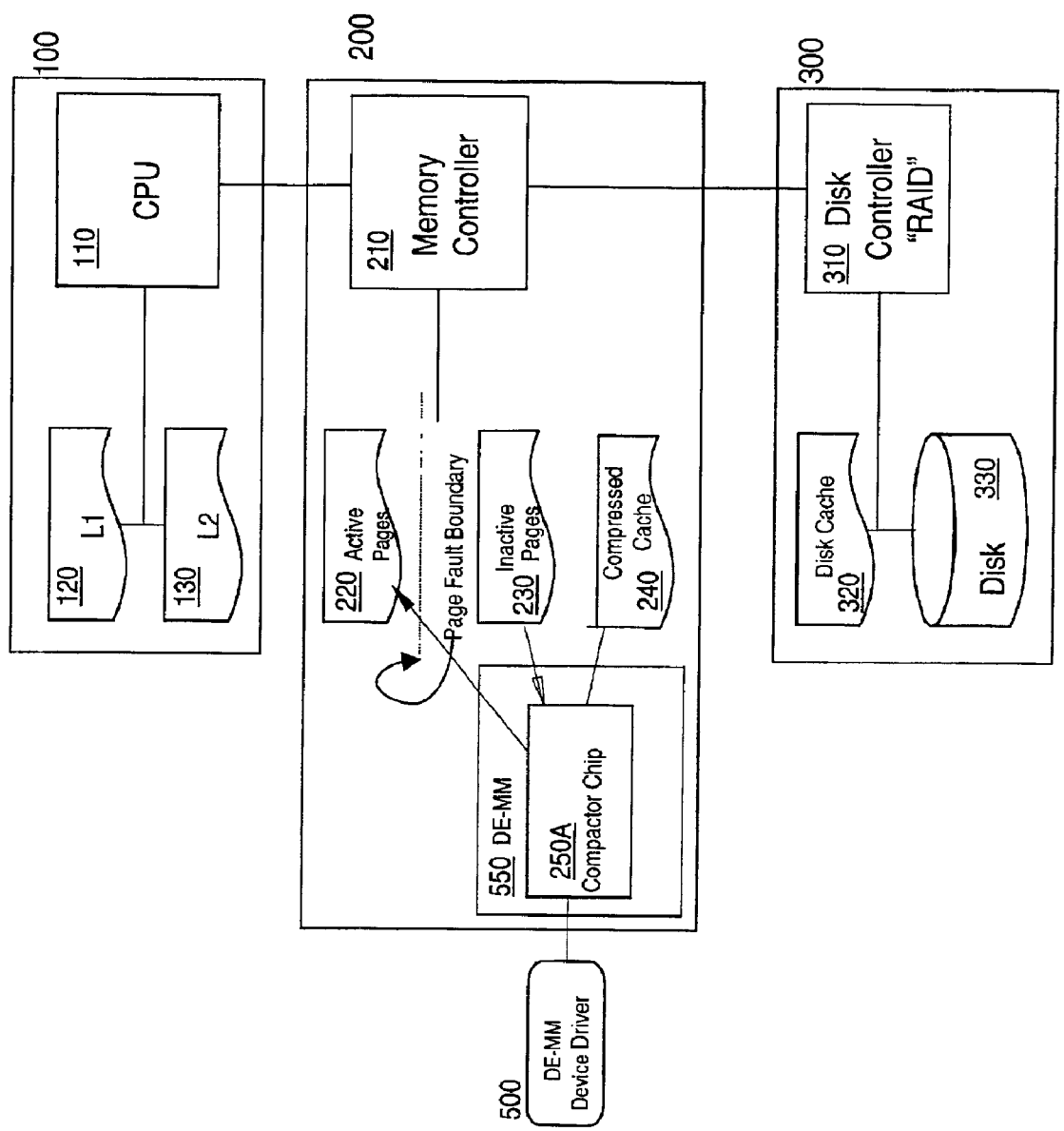
FIG. 14 illustrates the addition of a DE-MM to the system for control and operation of a compressed cache memory according to one embodiment.

FIG. 14—A Computer System with DE-MM

FIG. 14 illustrates one embodiment of a system including a C-DIMM (Compression Enabled Dual In-line Memory Module) 550 comprised as part of the system memory, with the C-DIMM driver 500 controlling the compactor chip 250A operations. This embodiment is shown and described for exemplary purposes; other embodiments of systems including one or more DE-MMs 550 of other types with associated drivers 500 or combinations of two or more other types of DE-MMs 550 with drivers 500 may be similar to the exemplary system as illustrated in FIG. 14. The C-DIMM 550 includes parallel compression and decompression technology that operates to increase the performance and/or reduce the cost of computers, including servers and workstations, by increasing the effective size and/or speed of memory. In one embodiment, the compactor chip 250A utilizes a method of using fast parallel compression and decompression technology as outlined in patent application Ser. Nos. 09/239,659, 09/421,968 and 09/491,343 as referenced above. The fast parallel compression and decompression operations are accomplished by mounting the compactor chip 250A, as seen in FIG. 14, preferably into a memory device or module, such as an industry standard DIMM, SIMM or SODIMM, SDDIMM or RIMM module. The C-DIMM 550 thus may comprise an industry standard memory module including a compression/decompression chip. The memory module is then compression/decompression enabled and may be plugged into the system memory subsystem 200 of the computing system.

In one embodiment, the compactor chip 250A acts as a compression and decompression co-processor under the direction of the application or C-DIMM driver 500 and other software modules. In alternate embodiments, the compactor chip may be in-line with the data transfer such that data is compressed or decompressed as it traverses between the CPU subsystem 100 and the memory subsystem 200. The fast parallel compression and decompression operations described above make the in-line embodiments feasible, as the compression and decompression of data are performed in real-time. In one embodiment with an in-line compactor chip, substantially all data transfers from the CPU subsystem 100 to the memory subsystem 200 are compressed by the compactor chip, and substantially all data transfers from the memory subsystem 200 to the CPU subsystem 100 are decompressed.

As indicated in FIG. 14, under direction of the C-DIMM software modules, inactive pages 230 are preferably compressed and may be stored in memory in a compressed format. This may be accomplished by a CPU read of the non-compressed inactive page 230 followed by a CPU write to the C-DIMM memory aperture by the CPU. In alternate embodiments, other circuits such as a DMA controller may perform the read and write operations. The C-DIMM memory aperture refers to a memory space, preferably on a C-DIMM 550, wherein data in the C-DIMM memory aperture may be operated on by the compactor chip 250A. The compactor chip 250A may operate to compress and/or decompress data in the C-DIMM memory operation. In response to the page write into the C-DIMM aperture, data is preferably compressed by the compactor chip 250A and stored in a C-DIMM read aperture. Then, the system CPU 110 or a DMA controller, may read the compressed data from the C-DIMM read aperture and write the compressed page to the compressed cache 240 memory area. In this case, the VMM 620 may believe that the data was transferred to disk whereas in reality the data was compressed and stored in the CC 240 in system memory.

When the virtual memory manager (VMM) 620 requests a page from disk, the C-DIMM software modules may first examine the Compressed Cache (CC) 240 for resident compressed pages. If the compressed page is resident within the CC 240, the C-DIMM software driver 500 may instruct the CPU (or DMA controller) to read the inactive compressed page from the CC 240 and instruct the compactor chip 250A to decompress the data during the read transfer. The CPU (or DMA controller) then writes the new active page into the area designated by the VMM 620. To the VMM 620 and file system 640, this process looks like a standard disk transfer of a page that had previously been swapped to disk and is read back to the active area of system memory. However, this was actually a fast decompression and read from the CC 240 to the designated active page 220 memory area. Thus, the use of compactor chip 250A and the allocation of the compressed cache 240 enables orders of magnitude faster response time when reading inactive, cached pages into the main memory 200 active page 220 memory area.

Figure 15:
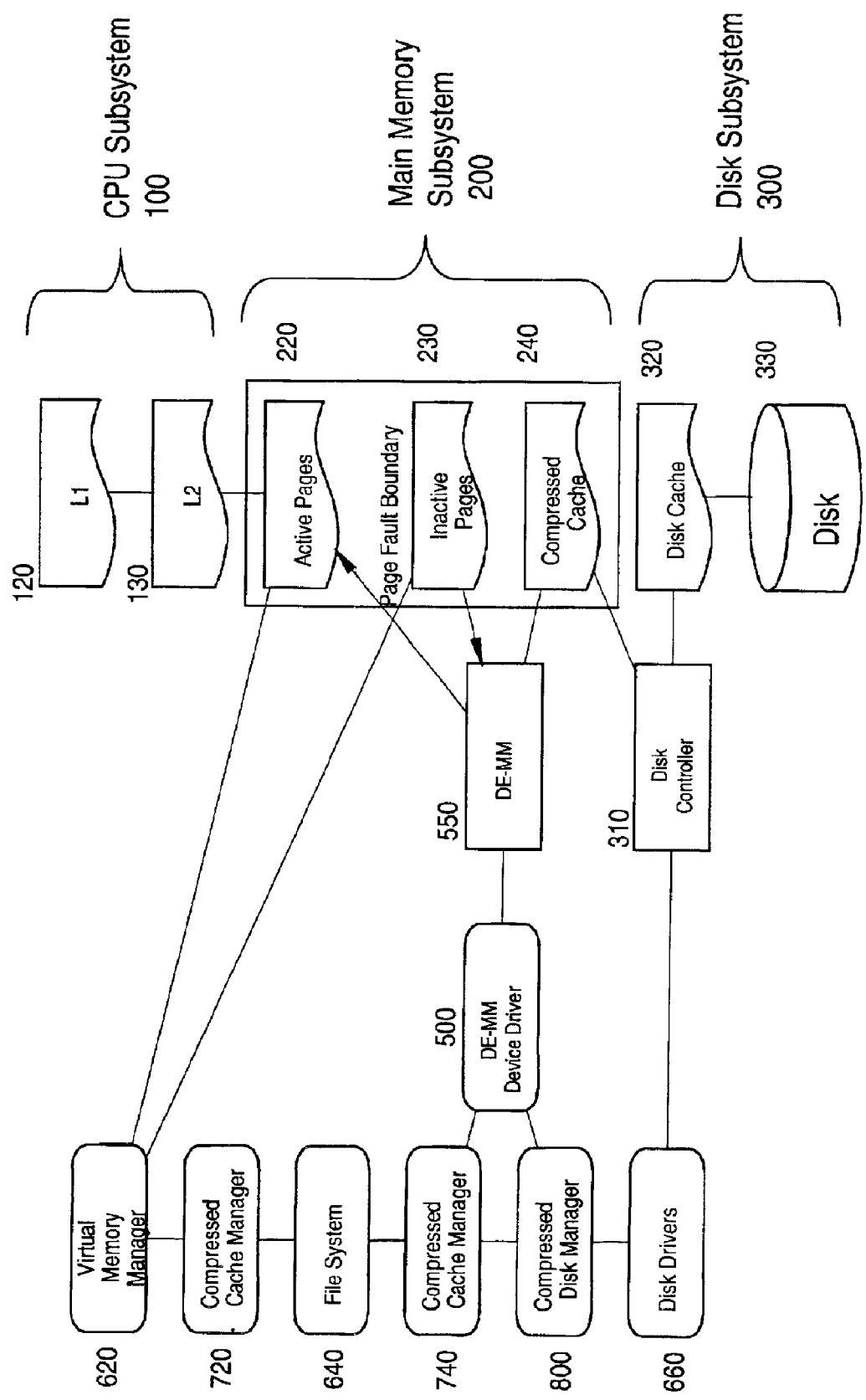
FIG. 15 is a block diagram illustrating software and hardware interfaces for DE-MM components according to one embodiment.

FIG. 15—Software and Hardware Interfaces for DE-MM Component Modules

FIG. 15 indicates one embodiment of a flow of operation between the CPU, memory and disk subsystems 100, 200, and 300, and the operating system software in an embodiment of a system implementing data compression/decompression with a C-DIMM 550. FIG. 15 is included to illustrate an example of system enhancing functionality that may be implemented with a DE-MM 550. Other embodiments implementing other functions with other types of DE-MMs 550 may use flows of operation similar to or different from the one shown here.

As indicated in the diagram of FIG. 15, the VMM 620 is responsible for allocation of active pages 220 and reallocation of inactive pages 230 in the main memory subsystem 200. The VMM 620 may determine when pages are to be tagged as inactive, when pages are to be moved to the disk subsystem 300, and when pages are to be restored from the disk subsystem 300 to inactive or active memory 220/230. According to one embodiment, the compressed cache filter/manager 720 may receive information from the VMM 620 to determine when and how the compressed cache 240 memory partition is manipulated and allocated.

The system may dynamically determine the amount of compressed cache 240 memory that is needed and may dynamically adjust the allocation size of the compressed cache 240. This dynamic adjustment algorithm may use a history of the page swapping operation over a period under direction of the file system 640 software. The system may use a novel page snooping algorithm, performed by the compressed cache manager 720 block, which looks at the number of I/O store and/or restore requests as a function of time. Thus, when the compressed cache manager (CCM) 720 sees that pages are not being stored as inactive pages 230 (less I/O subsystem activity), or onto the disk subsystem 300, then the CCM 720 software may not allocate system memory to compressed cache pages 240. In the above dynamic allocation algorithm, the compactor chip 250A may not be needed, as it may be assumed that the application fits into the memory subsystem 200 without the need for virtual storage onto disk. As more applications are instantiated and/or as current applications grow, requiring more memory than available from the memory subsystem 200, the CCM 720/740 may dynamically require the file system to allocate additional memory for the compressed cache 240. Thus, pages are moved under direction of the file system 640 and the compressed cache manager 740 between the inactive uncompressed page 230 memory area and the inactive compressed page 240 memory area. This procedure may be used during the reallocation of active pages 220 to inactive pages 230 where such pages are targeted for disk storage within the disk subsystem 300. Thus, for active pages that are targeted by the VMM 620 for storage to the disk subsystem 300 by the file system software 640, the system uses the compressed cache manager 720/740, the C-DIMM device driver 500 and the C-DIMM 550 hardware to compress and store such pages into the local compressed cache 240 instead of into the disk subsystem 300. In addition, the compressed cache allocation may use a set of novel cache algorithms to optimize compressed storage for the most active of the stale pages normally swapped to disk. In other words, based on the algorithm of the present invention, pages that show an active history of reuse may be compressed and stored in the compressed cache 240 while pages that show little history of reuse may be compressed and swapped to the compressed page partition in the disk subsystem 300. Thus, as the compressed cache 240 memory becomes full, the dynamic algorithm of the compressed cache manager 720/740 tags compressed pages according to a novel least recently used, lazy replacement LRU/LZU algorithm and retires low utilization compressed pages into the disk subsystem 300. In an alternate embodiment, the compressed pages that are stored onto the disk subsystem 300 may not be stored in a compressed partition but may be compressed for faster file transfer and bus I/O bandwidth improvements.

In order to accomplish storage of compressed pages to disk, the system uses another unique filter, the compressed disk filter/manager 800. The compressed disk manager 800 is a software module used like a secondary File Allocation Table (FAT) specifically designed for compressed pages. Thus, the system may retire compressed pages located in the compressed cache 240 buffer to the disk subsystem 300 for storage. In addition, if the compressed disk manager 800 is not installed, the compressed cache manager 740 may call the C-DIMM driver 500 to decompress a stale page prior to storage in the disk subsystem 300. Thus, the performance enhancement when using the compressed disk manager 800 has clear advantages over prior art disk compression technologies.

One embodiment also may decompress pages into the system memory subsystem 200 active page region 220 from either the compressed cache 240 memory area or directly from the disk subsystem 300. This process also requires the requests from the operating system software's virtual memory manager 620 for a page of data that the VMM 620 thinks resides in the disk subsystem 300. When a retired page is requested to be reissued to the active page 220 area of the memory subsystem 200, the compressed cache manager 720/740 searches its compressed cache 240 buffer allocation tables in order to see if the requested page is resident in the system memory 200 subsystem, or if the requested page may need to be restored from the disk subsystem 300. These two cases are discussed in separate process flows below.

When the compressed page is identified by the CCM 720/740 as being local to the system memory subsystem 200, the process of decompression and page write to the active page area 220 of memory begins. This may be accomplished in a number of steps. First, the compressed cache manager 720/740 may translate the page address from the file system 640 into an address pointer into the compressed cache 240 memory area. Second, the C-DIMM driver 500 is invoked by the CCM 720/740 to read the compressed page from the compressed cache 240 memory area and to begin the decompression process. Third, once the decompression of the compressed page is complete, the C-DIMM driver may also move the decompressed page to the active page 220 region of the memory subsystem 200. The CCM 740 is then notified that the page decompression and move process has completed by the C-DIMM driver 500. The CCM 720/740 then finishes the operation by notification to the file system 640, and finally the VMM 620 is notified that the page is in active page 220 region and is ready for processing by the resident application software. Additionally, multiple pages can be strung together such that the above steps are concatenated to streamline the process steps.

In one embodiment, when a compressed page is identified as requiring decompression to the active page area, the system identifies or anticipates other pages that may require decompression in the future, using a type of pre-fetch mechanism. When the compressed page is not identified by the CCM 720/740 as being resident to the local compressed cache 240 region, then the compressed page may be read and restored to the active page 220 region of the system memory subsystem 200 from the disk subsystem 300. This process may require a call to the compressed disk manager 800 if the page was stored in compressed format on the disk subsystem 300. If the compressed disk manager 800 is installed in the system and the page is located in the compressed disk partition, the compressed disk manager software 800 may translate the disk sector address to the compressed disk partition sector address. Once the compressed disk sector address is determined by a FAT2 (Compressed File Allocation Table) lookup, compressed data is read from the disk subsystem 300 into compressed cache 240 memory region. This data move may be done with a system DMA from the disk subsystem 300 into the system memory subsystem 200. To accomplish the initial move, the compressed disk manager 800 module may request from the disk drivers 660 a disk controller 310 operation to retrieve the proper page or pages from the disk subsystem 300. When disk access of compressed pages has finished by indication from the disk drivers 660 to the compressed disk manager 800, the decompression operation of the compressed page may be invoked by a call from the compressed disk manager 800 to the C-DIMM device driver 500. The C-DIMM device driver may initiate the decompression process by prompting the CPU or DMA device to move the compressed page through the compactor chip 250A located on the C-DIMM 550 device. The CPU or DMA device reads the coherent decompressed page and then writes that page into the active page 220 area of the memory subsystem 200. Typically, the CPU cache is updated by the read, and application execution can begin immediately. In an alternate embodiment, the write of the decompressed page back to system memory 200 may happen later, restoring the coherent data into the active page 220 region of the system memory subsystem 200. Once the active page is restored to the area allocated by the file system 640 software, the VMM 620 is notified that the active page is now ready for application operation.

If the compressed disk manager 800 is not installed in the system and the page is located in a normal non-compressed disk partition, the system need not invoke the C-DIMM driver 500 or the C-DIMM 550 and may restore the non-compressed page(s) directly into the active page 220 region of the memory subsystem 200. The operation of the VMM 620 and the file system 640 may be similar to that described previously when the compressed disk manager 800 was invoked, except that the compressed cache manager 720/740 is preferably not invoked to restore the non-compressed page from disk to the active page 220 region of the memory subsystem 200.

In addition, the same process can be used for network systems where compressed pages are transferred between servers connected on a local area or wide area network. In this alternate embodiment, pages are compressed by the compactor chip under direction of a network driver filter that is similar to the Compressed Disk Partition Manager 800, except that these pages are targeted for sending to remote client or application servers. Compressed data pages can also be sent to other client computers where data can be decompressed by either the compactor chip 250A or a similar derivative, or alternatively by software such as software plug-in modules previously installed in the client end computers.

In addition, the system is not limited to the use of file filters as indicated in the described software embodiments, but may have specific operations defined and embedded into the operating system software kernel. Thus, operation of the present invention may be enabled by specific instructions and routines embedded directly into the kernel of the operating system. Also, the C-DIMM driver 500 may have a proprietary callable application specific interface that can be used directly by applications such as database software, CAD tools, and any other application programs when specific compression and decompression tasks are required.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A method for detecting device-enhanced memory modules in a system including one or more memory modules comprising system memory, wherein at least one of the one or more memory modules is a device-enhanced memory module comprising one or more embedded devices, the method comprising:
    writing a data sequence to a first memory module of the one or more memory modules in the system;
    reading the data sequence from the first memory module; and
    identifying the first memory module as a device-enhanced memory module if the data sequence as read from the first memory module is modified from the data sequence as written to the first memory module.

2. The method of claim 1, further comprising:
    identifying the first memory module as not being a device-enhanced memory module if the data sequence read from the first memory module is the same as the data sequence as written to the first memory module.

3. The method of claim 1, wherein the data sequence is modified by an embedded device comprised on the first memory module prior to said reading the data sequence from the first memory module.

4. The method of claim 1, wherein the data sequence includes one or more computer instructions that are illegal instructions for reads and writes to the system memory during normal program execution within the system, wherein the one or more illegal computer instructions are operable to prevent the data sequence from being accidentally written to the system memory during normal operation of the system.

5. The method of claim 1, further comprising, after said identifying the first memory module as a device-enhanced memory module:
    writing a plurality of data writes to the first memory module; and
    the first memory module learning an error detection and correction scheme of the system from the plurality of data writes.

6. The method of claim 5, wherein each of the plurality of data writes includes a plurality of data bits and a plurality of check bits, wherein the plurality of data writes includes one data write for each of the plurality of data bits, wherein the particular data bit is set in the data write and all other data bits are not set, and wherein the check bits are set as appropriate for the data write in the error detection and correction scheme.

7. The method of claim 6, wherein the plurality of data writes further includes one data write with no data bits set, wherein the check bits of the data write are set as appropriate for the data write with no data bits set in the error detection and correction scheme.

8. The method of claim 7, further comprising:
storing the check bits for the data write with no data bits set;
wherein, when applying the learned error detection and correction scheme, the stored check bits for the data write with no data bits set are used as a check bit inversion mask for data writes to and from the first memory module.

9. The method of claim 5, wherein said learning the error detection and correction scheme comprises:
generating check bit masks for each of the plurality of check bits using the check bits and the data bits of each of the data writes with one data bit set; and
storing the generated check bit masks;
wherein, when applying the learned error detection and correction scheme, the check bit masks are used in generating check bits for data writes to and from the first memory module.

10. The method of claim 5, wherein said learning the error detection and correction scheme comprises:
for each of the data writes with one set data bit:
storing a position of the set data bit in the plurality of data bits in a syndrome array at a location indicated by the check bits of the data write;
wherein the check bits of each of the data writes for the plurality of data bits define an error detection and correction code associated with the data bit position of the set data bit in the data write;
wherein, when applying the learned error detection and correction scheme, each of the stored data bit positions is retrievable from the syndrome array using the error detection and correction code associated with the particular data bit position.

11. The method of claim 5, further comprising:
configuring error detection and correction logic of the first memory module to use the learned error detection and correction scheme;
wherein the configured error detection and correction logic is operable to provide error detection and correction for data writes to and from the first memory module using the learned error detection and correction scheme.

12. The method of claim 5, further comprising verifying the learned error detection and correction scheme for the first memory module after said learning the error detection and correction scheme.

13. The method of claim 5, further comprising:
writing a plurality of data values to the first memory module;
the first memory module generating error detection and correction data for the plurality of data values using the learned error detection and correction scheme;
examining the generated error detection and correction data; and
if the generated error detection and correction data is correct according to the learned error detection and correction scheme, indicating that said learning the error detection and correction scheme succeeded; and
if the generated error detection and correction data is not correct according to the learned error detection and correction scheme, indicating that said learning the error detection and correction scheme failed.

14. The method of claim 1, further comprising identifying interleave settings for the first memory module after said identifying the first memory module as a device-enhanced memory module, wherein the interleave settings include an interleave value and a number of cache lines used for interleaving the system memory.

15. The method of claim 14, further comprising verifying the identified interleave settings for the first memory module.

16. The method of claim 15, wherein said verifying the identified interleave settings comprises:
writing a first block of data to an input buffer on the first memory module, wherein the input buffer is used by an embedded device on the first memory module for receiving input data;
the embedded device reading the first block of data from the input buffer;
the embedded device writing the first block of data to an output buffer on the first memory module, wherein the output buffer is used by the embedded device for outputting data;
reading the first block of data from the output buffer;
examining the first block of data read from the output buffer; and
verifying the interleave settings in response to said examining the first block of data read from the output buffer.

17. The method of claim 1, further comprising:
writing a plurality of data values to each of a plurality of burst lines in a memory region of the first memory module, wherein, if the first memory module is interleaved with one or more other memory modules, a first portion of the plurality of data values are written to the memory region of the first memory module and a second portion of the plurality of data values are written to the one or more other memory modules with which the first memory module is interleaved;
reading one or more of the plurality of data values written to the memory region; and
examining the one or more data values read from the memory region to determine the interleave characteristics of the first memory module.

18. The method of claim 1, further comprising, after said identifying the first memory module as a device-enhanced memory module:
reading one or more hardware identification values from the first memory module; and
storing the one or more hardware identification values in a memory region accessible by a device driver for the first memory module.

19. The method of claim 1, further comprising, after said identifying the first memory module as a device-enhanced memory module:
writing one or more configuration values to one or more of a plurality of registers on the first memory module, wherein the configuration values are configured for use during operation of an embedded device on the first memory module;

wherein the configuration values include one or more of a sleep mode timer value, a restart timer value, an error timer value, and a driver version of a device driver for the embedded device on the first memory module.

20. The method of claim 1, wherein said writing, said reading, and said identifying are performed during system startup.

21. The method of claim 1, further comprising, after said identifying the first memory module as a device-enhanced memory module:

learning an error detection and correction scheme for the first memory module;

identifying interleave settings for the first memory module;

performing a buffer check for the first memory module; and storing one or more hardware identification values to one or more registers on the first memory module.

22. The method of claim 21, wherein said writing, said reading, said learning, said identifying, said performing, and said storing are performed during system startup.

23. The method of claim 1, further comprising, after said identifying the first memory module as a device-enhanced memory module, wherein said initializing includes:

initializing the first memory module to use an error detection and correction scheme of the system; and initializing the first memory module to use a memory interleave method, if any, of the system;

wherein, after said initializing the first memory module to use an error detection and correction scheme and said initializing the first memory module to use a memory interleave method, an embedded device on the first memory module is accessible to perform one or more functions on the system.

24. The method of claim 1, further comprising:

initializing the first memory module to operate in a system memory implementation after said identifying the first memory module as a device-enhanced memory module; and sending an end initialization sequence to the first memory module after said initializing;

wherein, after receiving the end initialization sequence, an embedded device on the first memory module is accessible to perform one or more functions on the system.

25. The method of claim 1, further comprising:

initializing the first memory module to operate in a system memory implementation after said identifying the first memory module as a device-enhanced memory module; and wherein, after said initializing, an embedded device on the first memory module is accessible to perform one or more functions on the system.

26. The method of claim 25, further comprising:

the embedded device on the first memory module entering sleep mode after said initializing, wherein, in the sleep mode, the embedded device is not accessible to perform the one or more functions, and wherein the embedded device operates with reduced power requirements in sleep mode.

27. The method of claim 26, further comprising, after said entering sleep mode, repeating said writing, said reading, said identifying and said initializing, wherein, after said repeating, the embedded device on the first memory module is again accessible to perform the one or more functions on the system.

28. The method of claim 1, wherein an embedded device on the first memory module is a compression/decompression engine.

29. A method for detecting device-enhanced memory modules in a system including a plurality memory modules comprising system memory, wherein one or more of the plurality of memory modules are device-enhanced memory modules each comprising one or more embedded devices, the method comprising:

writing one or more data sequences including a last data sequence to each of a plurality of memory regions in the system memory;

reading at least the last data sequence from each of the plurality of memory regions in the system memory; and identifying one or more of the plurality of memory modules as device-enhanced memory modules in response to said reading the at least the last data sequence from each of the plurality of memory regions in the system memory;

wherein a first memory module of the plurality of memory modules is identified as a device-enhanced memory module if the at least the last data sequence read from a memory region on the first memory module is different than the at least the last data sequence as written to the memory region on the first memory module.

30. The method of claim 29, wherein a second memory module is identified as not being a device-enhanced memory module if the at least the last data sequence read from a memory region on the second memory module is the same as the at least the last data sequence as written to the memory region on the second memory module.

31. The method of claim 29, wherein the plurality of memory regions includes at least one memory region on each of the plurality of memory modules comprising the system memory.

32. The method of claim 29, wherein the data sequence is modified by an embedded device comprised on each of the one or more memory modules identified as device-enhanced memory modules prior to said reading the at least the last data sequence from the one or more memory modules identified as device-enhanced memory modules.

33. The method of claim 29, further comprising, after said identifying the one or more memory modules as device-enhanced memory modules:

writing a plurality of data writes to each of the one or more memory modules identified as device-enhanced memory modules;

each of the one or more memory modules identified as device-enhanced memory modules learning an error detection and correction scheme of the system from the plurality of data writes; and configuring error detection and correction logic of each of the one or more memory modules identified as device-enhanced memory modules in accordance with the learned error detection and correction scheme;

wherein the configured error detection and correction logic of each of the one or more memory modules identified as device-enhanced memory modules is operable to provide error detection and correction for data writes to and from the memory module in accordance with the learned error detection and correction scheme.

34. The method of claim 29, further comprising:

identifying interleave settings for each of the one or more memory modules identified as device-enhanced memory modules, wherein the interleave settings include an interleave value and a number of cache lines used for interleaving the system memory.

35. The method of claim 29, further comprising:
reading one or more hardware identification values from each of the one or more memory modules identified as device-enhanced memory modules; and
storing the one or more hardware identification values in one or more memory regions accessible by one or more device drivers for the one or more memory modules identified as device-enhanced memory modules.

36. The method of claim 29, further comprising:
for each of the one or more memory modules identified as device-enhanced memory modules:
writing one or more configuration values to one or more of a plurality of registers on the memory module, wherein the configuration values are configured for use during operation of an embedded device on the memory module;
wherein the configuration values include one or more of a sleep mode timer value, a restart timer value, an error timer value, and a driver version of a device driver for the embedded device on the memory module.

37. The method of claim 29, wherein said writing, said reading, and said identifying are performed during system startup.

38. The method of claim 29, further comprising:
initializing the one or more memory modules to operate in a system memory implementation after said identifying the one or more memory modules as device-enhanced memory modules; and
wherein, after said initializing, each of one or more embedded devices on each of the one or more memory modules is accessible to perform one or more functions on the system.

39. The method of claim 29, wherein one or more embedded devices on the one or more memory modules identified as device-enhanced memory modules are compression/decompression engines.

40. A system comprising:
a plurality of memory modules comprising system memory, wherein at least one of the plurality of memory modules comprises one or more embedded devices;
a device driver executable within the system to:
write one or more data sequences including a last data sequence to each of a plurality of memory regions in the system memory;
read at least the last data sequence from each of the plurality of memory regions in the system memory;
identify one or more of the plurality of memory modules as device-enhanced memory modules in response to said reading the at least the last data sequence from each of the plurality of memory regions in the system memory; and
wherein a first memory module of the plurality of memory modules is identified as a device-enhanced memory module if the at least the last data sequence read from a memory region on the first memory module is different than the at least the last data sequence as written to the memory region on the first memory module.

41. The system of claim 40, wherein a second memory module is identified as not being a device-enhanced memory module if the at least the last data sequence read from a memory region on the second memory module is the same as the at least the last data sequence as written to the memory region on the second memory module.

42. The system of claim 40, wherein, after said identifying the one or more memory modules as device-enhanced memory modules, the device driver is further executable to:
write a plurality of data writes to each of the one or more memory modules identified as device-enhanced memory modules, wherein each of the one or more memory modules identified as device-enhanced memory modules is configured to learn an error detection and correction scheme of the system from the plurality of data writes;
configure error detection and correction logic of each of the one or more memory modules identified as device-enhanced memory modules in accordance with said learned error detection and correction scheme;
wherein the configured error detection and correction logic of each of the one or more memory modules identified as device-enhanced memory modules is operable to provide error detection and correction for data writes to and from the memory module in accordance with the learned error detection and correction scheme.

43. The system of claim 40, wherein, after said identifying the one or more memory modules as device-enhanced memory modules, the device driver is further executable to:
identify interleave settings for each of the one or more memory modules identified as device-enhanced memory modules, wherein the interleave settings include an interleave value and a number of cache lines used for interleaving the system memory.

44. The system of claim 40, wherein, after said identifying the one or more memory modules as device-enhanced memory modules, the device driver is further executable to:
read one or more hardware identification values from each of the one or more memory modules identified as device-enhanced memory modules; and
store the one or more hardware identification values in one or more memory regions accessible by the device driver.

45. The system of claim 40, wherein, after said identifying the one or more memory modules as device-enhanced memory modules, the device driver is further executable to:
for each of the one or more memory modules identified as device-enhanced memory modules:
write one or more configuration values to one or more of a plurality of registers on the memory module, wherein the configuration values are configured for use during operation of an embedded device on the memory module;
wherein the configuration values include one or more of a sleep mode timer value, a restart timer value, an error timer value, and a driver version of a device driver for the embedded device on the memory module.

46. The system of claim 40, wherein the device driver is configured to perform said writing, said reading, and said identifying during system startup.

47. The system of claim 40, wherein the device driver is further executable to:
initialize the one or more memory modules to operate in a system memory implementation of the system after said identifying the one or more memory modules as device-enhanced memory modules; and
wherein, after said initializing, each of one or more embedded devices on each of the one or more memory modules is accessible to perform one or more functions on the system.

48. The method of claim 40, wherein one or more embedded devices on the one or more memory modules identified as device-enhanced memory modules are compression/decompression engines.

49. A carrier medium comprising program instructions for detecting device-enhanced memory modules in a system including one or more memory modules comprising system memory, wherein at least one of the one or more memory modules is a device-enhanced memory module comprising one or more embedded devices, wherein the program instructions are computer-executable to implement:

writing a data sequence to a first memory module of the one or more memory modules in the system;

reading the data sequence from the first memory module;

identifying the first memory module as a device-enhanced memory module if the data sequence as read from the first memory module is modified from the data sequence as written to the first memory module; and identifying the first memory module as not being a device-enhanced memory module if the data sequence read from the first memory module is the same as the data sequence as written to the first memory module.

* * * * *